US009768362B2

(12) United States Patent
Park et al.

(10) Patent No.: US 9,768,362 B2
(45) Date of Patent: Sep. 19, 2017

(54) LIGHT-EMITTING DEVICE AND METHOD OF MANUFACTURING THE SAME

(71) Applicant: Seoul Viosys Co., Ltd., Ansan-si (KR)

(72) Inventors: Jun Yong Park, Ansan-si (KR); Hee Cheul Jung, Ansan-si (KR); In Kyu Park, Ansan-si (KR); Daewoong Suh, Ansan-si (KR)

(73) Assignee: Seoul Viosys Co., Ltd., Ansan-si (KR)

( * ) Notice: Subject to any disclaimer, the term of this patent is extended or adjusted under 35 U.S.C. 154(b) by 0 days.

(21) Appl. No.: 14/981,301

(22) Filed: Dec. 28, 2015

(65) Prior Publication Data

US 2016/0111606 A1  Apr. 21, 2016

Related U.S. Application Data

(63) Continuation of application No. 14/002,966, filed as application No. PCT/KR2013/001739 on Mar. 5, 2013, now Pat. No. 9,240,524.

(30) Foreign Application Priority Data

Mar. 5, 2012 (KR) .................. 10-2012-0022476
Mar. 9, 2012 (KR) .................. 10-2012-0024644
(Continued)

(51) Int. Cl.
*H01L 33/48* (2010.01)
*H01L 33/62* (2010.01)
(Continued)

(52) U.S. Cl.
CPC ............ *H01L 33/483* (2013.01); *H01L 33/48* (2013.01); *H01L 33/486* (2013.01); *H01L 33/58* (2013.01);
(Continued)

(58) Field of Classification Search
CPC ..... H01L 33/62; H01L 33/486; H01L 33/647; H01L 33/641; H01L 33/64; H01L 33/642; H01L 33/644
See application file for complete search history.

(56) References Cited

U.S. PATENT DOCUMENTS 7,268,014 B2    9/2007  Lee et al.
9,263,315 B2 *  2/2016  Oda .................. H01L 21/6835
(Continued)

FOREIGN PATENT DOCUMENTS

JP    2005-039100    2/2005
JP    2006-269079    10/2006
(Continued)

OTHER PUBLICATIONS

Non-Final Office Action issued on Nov. 6, 2014, in U.S. Appl. No. 14/002,966.
(Continued)

*Primary Examiner* — Matthew Landau
*Assistant Examiner* — Scott Stowe
(74) *Attorney, Agent, or Firm* — H.C. Park & Associates, PLC

(57) ABSTRACT

Disclosed are a light-emitting device and a manufacturing method thereof. A light-emitting device according to a preferred embodiment of the disclosure comprises: a frame portion having a bottom and a sidewall; a light-emitting portion which is disposed on the frame portion and emits light; and a window portion disposed over the frame portion so as to cover the light-emitting portion.

17 Claims, 18 Drawing Sheets

(30) Foreign Application Priority Data

Mar. 9, 2012 (KR) ........................ 10-2012-0024700
Jan. 9, 2013 (KR) ........................ 10-2013-0002435

(51) Int. Cl.
  H01L 33/58 (2010.01)
  *H01L 25/075* (2006.01)

(52) U.S. Cl.
  CPC .......... *H01L 33/62* (2013.01); *H01L 25/0753* (2013.01); *H01L 2224/48091* (2013.01); *H01L 2933/0033* (2013.01); *H01L 2933/0066* (2013.01)

(56) References Cited

U.S. PATENT DOCUMENTS

| | | |
|---|---|---|
| 2003/0102481 A1 | 6/2003 | Isoda |
| 2004/0070338 A1* | 4/2004 | Noguchi .............. H01L 33/486 313/512 |
| 2004/0150335 A1 | 8/2004 | Horiuchi et al. |
| 2004/0201987 A1 | 10/2004 | Omata |
| 2006/0145340 A1* | 7/2006 | Tseng ...................... H05K 3/06 257/724 |
| 2006/0246617 A1 | 11/2006 | Lee et al. |
| 2009/0272971 A1 | 11/2009 | Lee et al. |
| 2011/0186872 A1 | 8/2011 | Kim |
| 2011/0198649 A1* | 8/2011 | Yamada ............... H01L 33/486 257/98 |
| 2011/0210358 A1 | 9/2011 | Kim et al. |
| 2011/0297985 A1 | 12/2011 | Naka |
| 2012/0091500 A1 | 4/2012 | Matoba et al. |
| 2012/0138990 A1 | 6/2012 | Sato et al. |
| 2012/0313115 A1* | 12/2012 | Joo ...................... H01L 33/486 257/88 |
| 2015/0340570 A1 | 11/2015 | Seo |

FOREIGN PATENT DOCUMENTS

| | | |
|---|---|---|
| JP | 2011-505689 | 2/2011 |
| JP | 2011-210787 | 10/2011 |
| JP | 2012-028436 | 2/2012 |
| JP | 2012-038999 | 2/2012 |
| KR | 10-0593943 | 6/2006 |
| KR | 10-2006-0104165 | 10/2006 |
| KR | 10-2009-0078480 | 7/2009 |
| KR | 10-2011-0109650 | 10/2011 |
| KR | 10-2012-0014416 | 2/2012 |
| WO | WO 2011122665 A1 * 10/2011 ......... H01L 21/6835 |

OTHER PUBLICATIONS

Notice of Allowance issued on May 29, 2015, in U.S. Appl. No. 14/002,966.
Notice of Allowance issued on Sep. 16, 2015, in U.S. Appl. No. 14/002,966.
Non-Final Office Action issued on Nov. 5, 2014, in U.S. Appl. No. 14/069,343.
Final Office Action issued on Jul. 8, 2015, in U.S. Appl. No. 14/069,343.
Notice of Allowance issued on Sep. 24, 2015, in U.S. Appl. No. 14/069,343.
Korean Office Action dated Dec. 21, 2016, in Korean Patent Application No. 10-2012-0024700.
Korean Office Action dated Apr. 21, 2017, in Korean Patent Application No. 10-2013-0002435 with English Translation.
Korean Office Action dated Apr. 21, 2017, in Korean Patent Application No. 10-2012-0024700 in English Translation.

* cited by examiner

[Fig. 1]
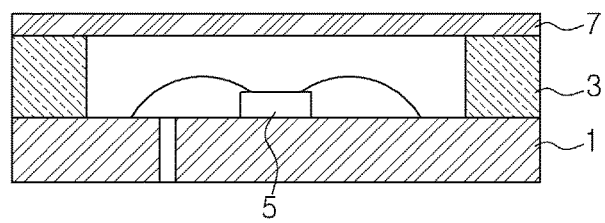
[Fig. 2]
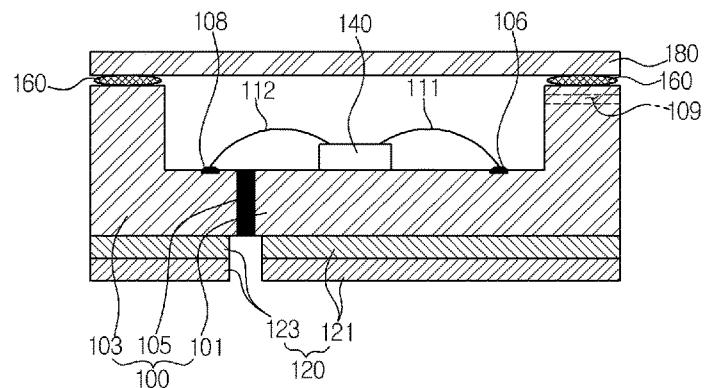
[Fig. 3]
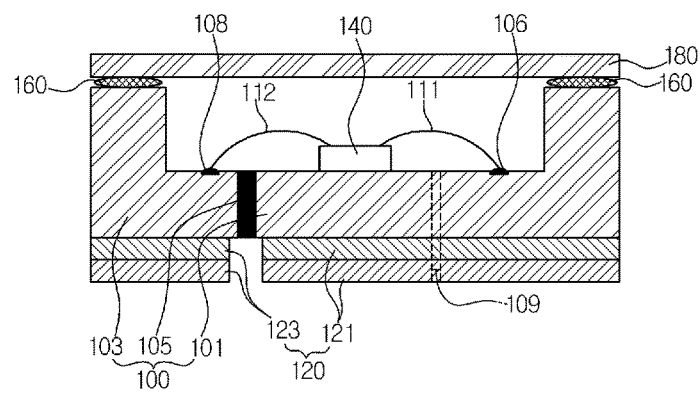
[Fig. 4]
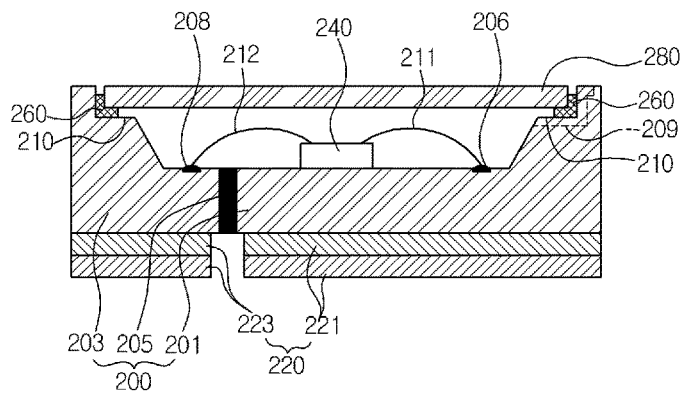

[Fig. 5]
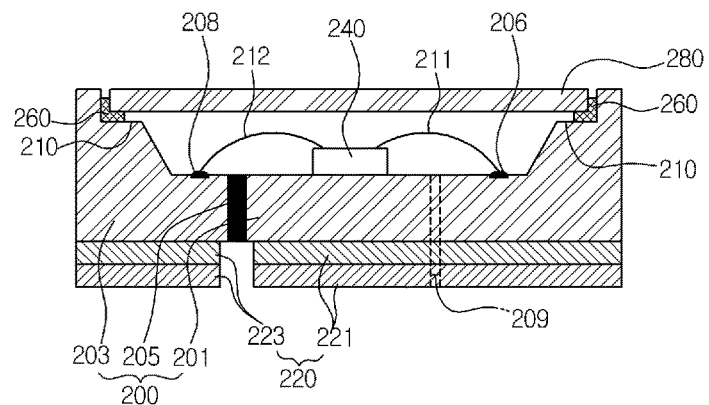
[Fig. 6]
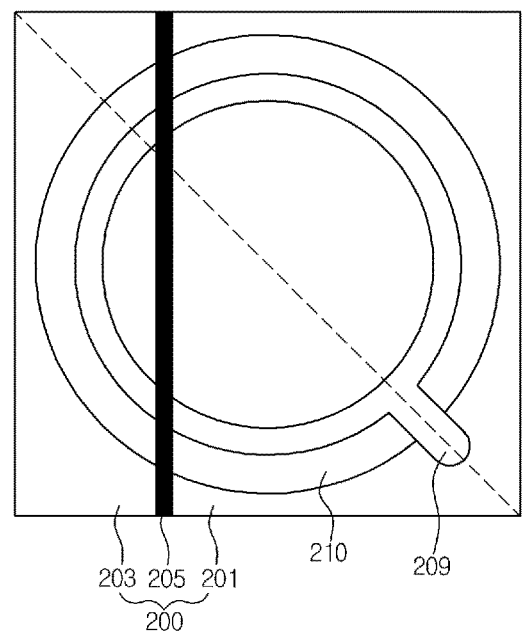
[Fig. 7]
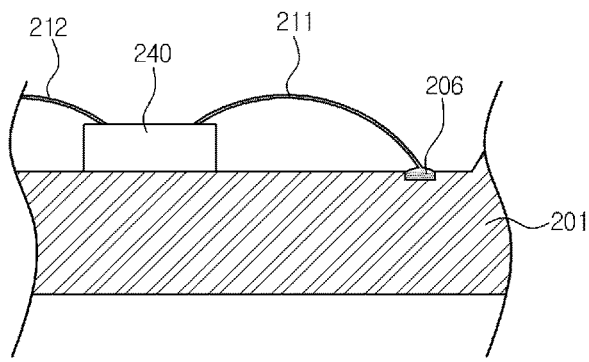

[Fig. 8]
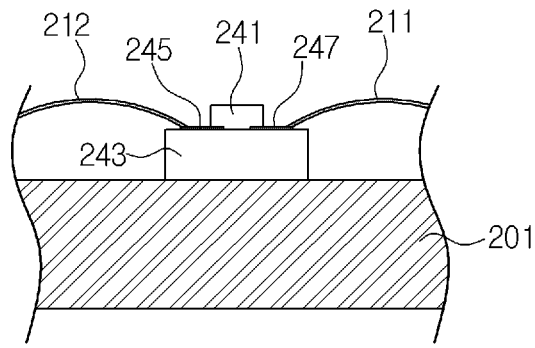
[Fig. 9a]
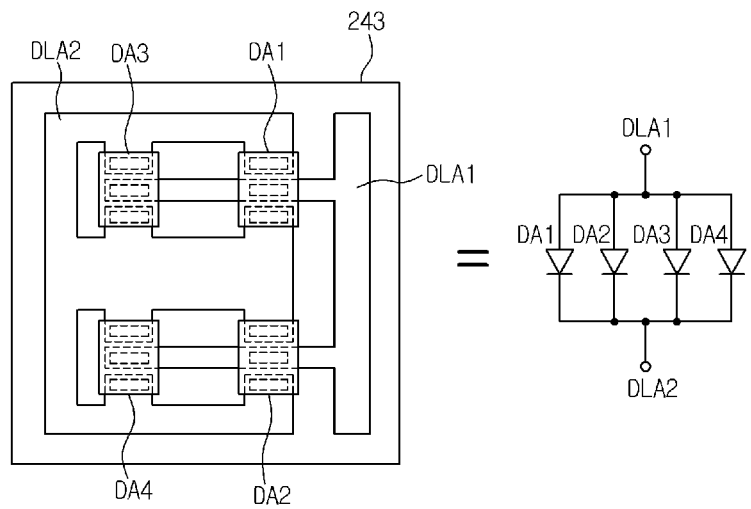
[Fig. 9b]
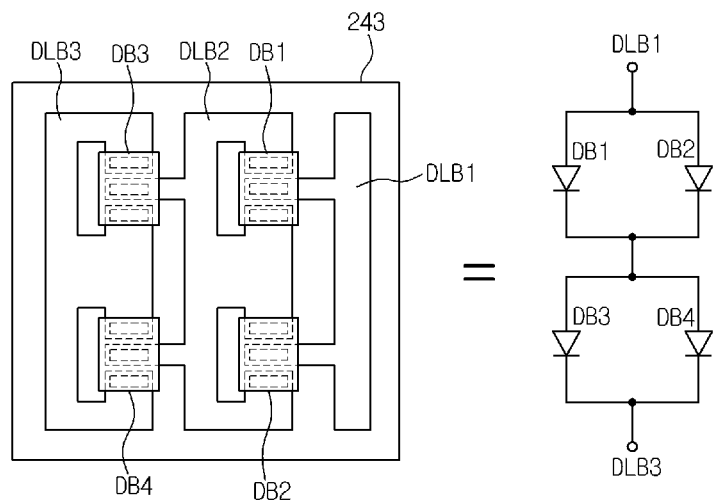

[Fig. 9c]
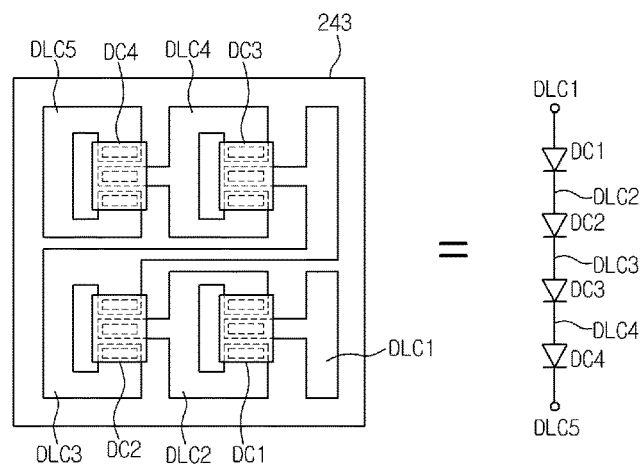
[Fig. 10]
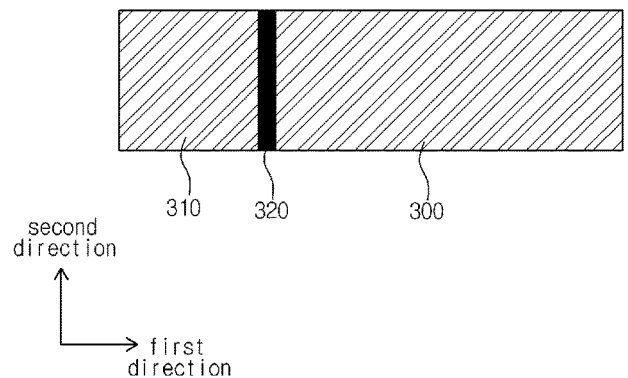
[Fig. 11]
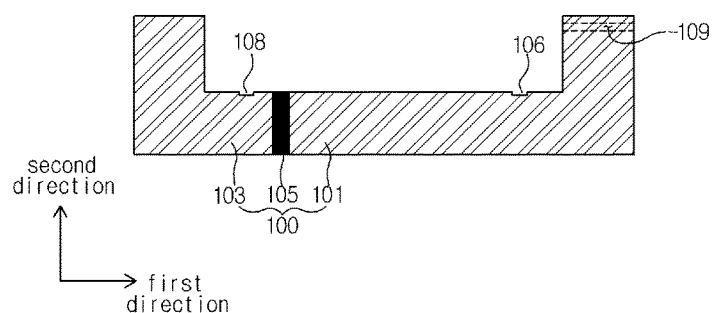
[Fig. 12]
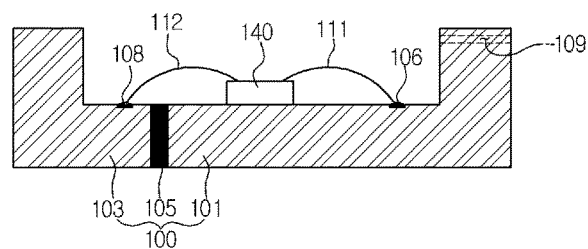

[Fig. 13]
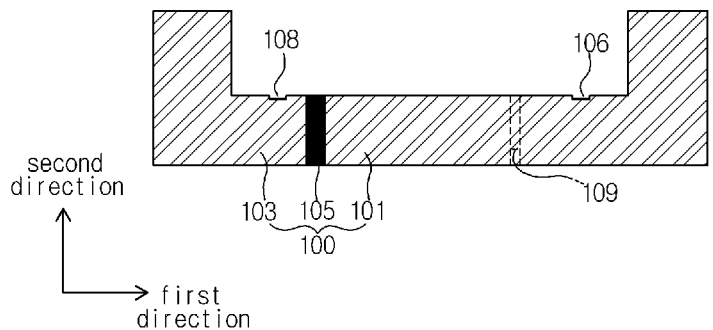
[Fig. 14]
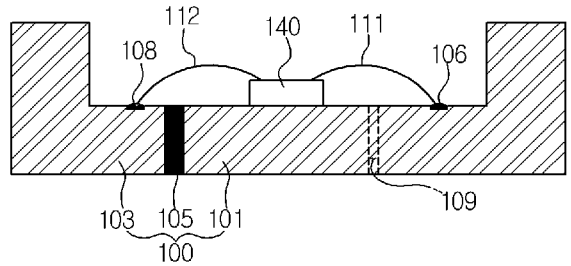
[Fig. 15]
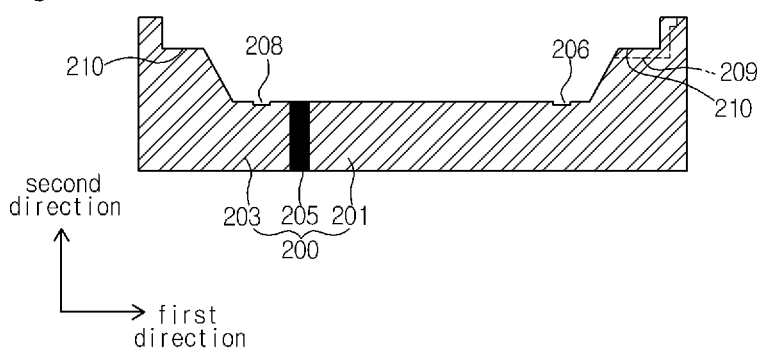
[Fig. 16]
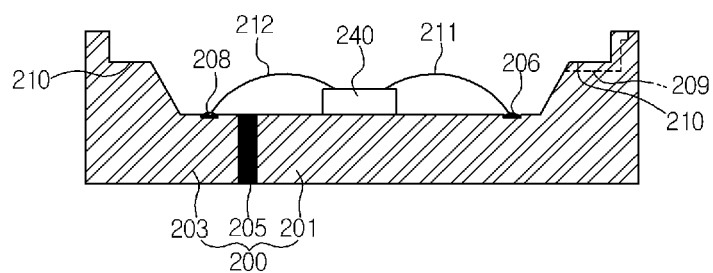

[Fig. 17]
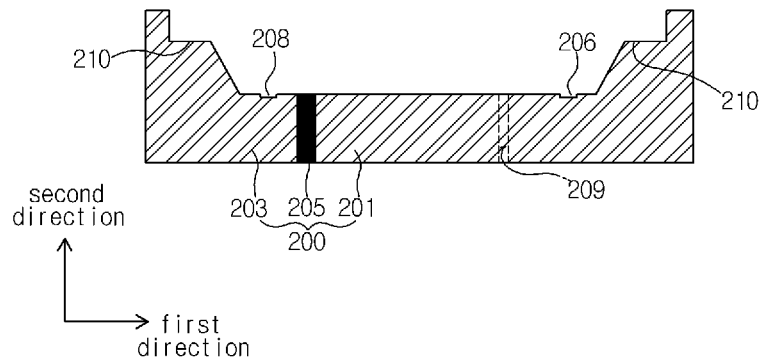
[Fig. 18]
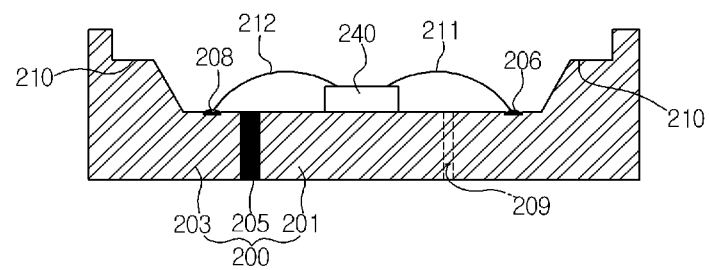
[Fig. 19]
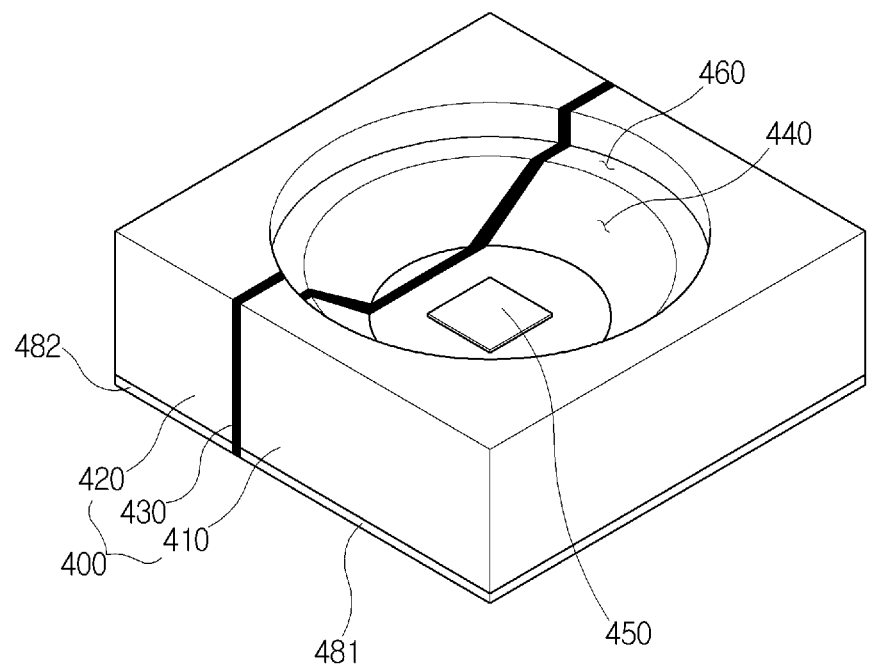

[Fig. 20]
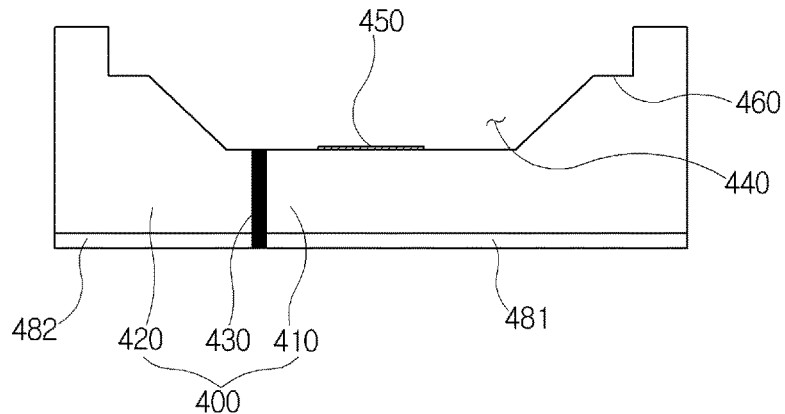
[Fig. 21]
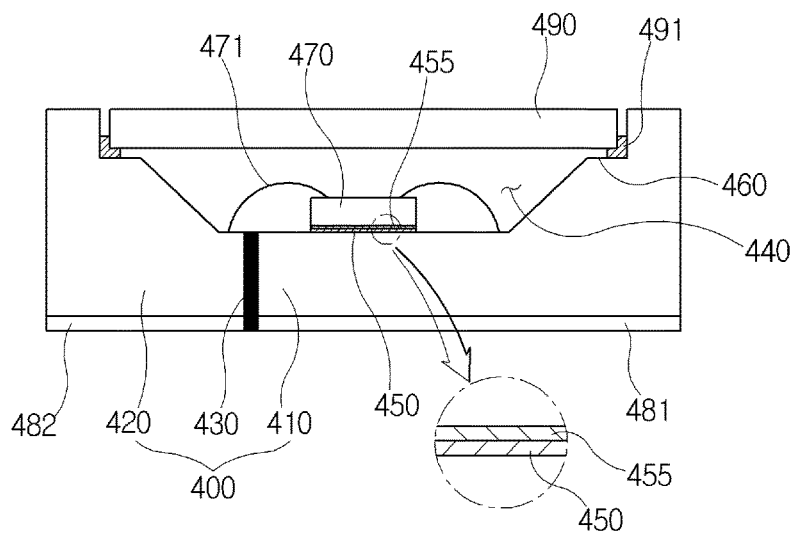
[Fig. 22]
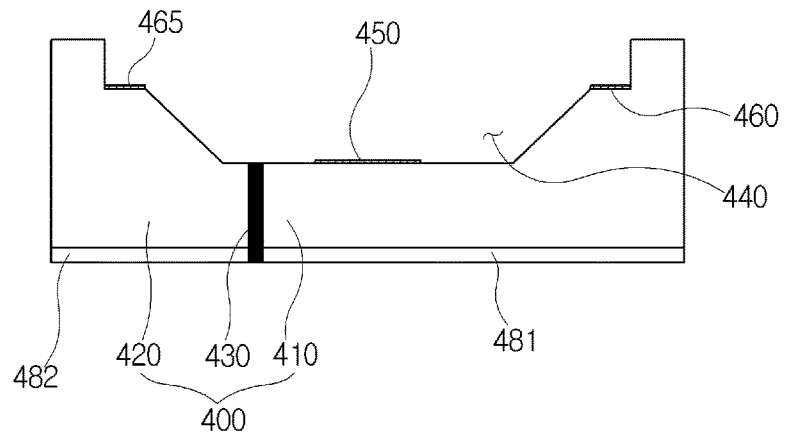

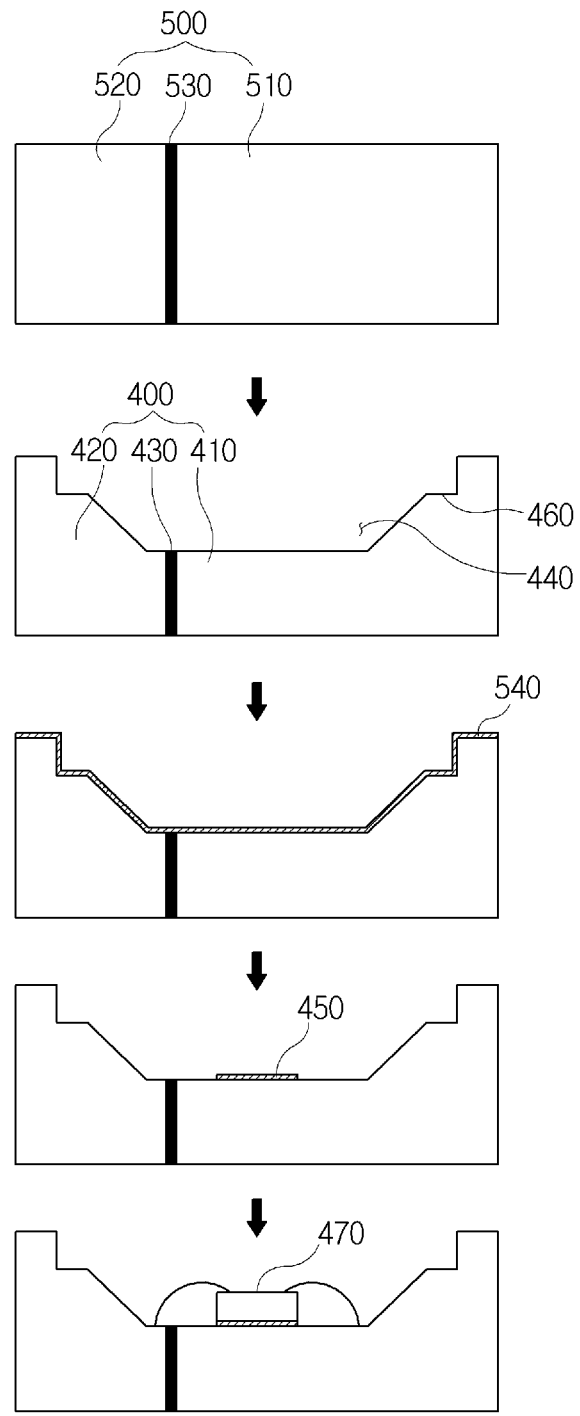
[Fig. 23]

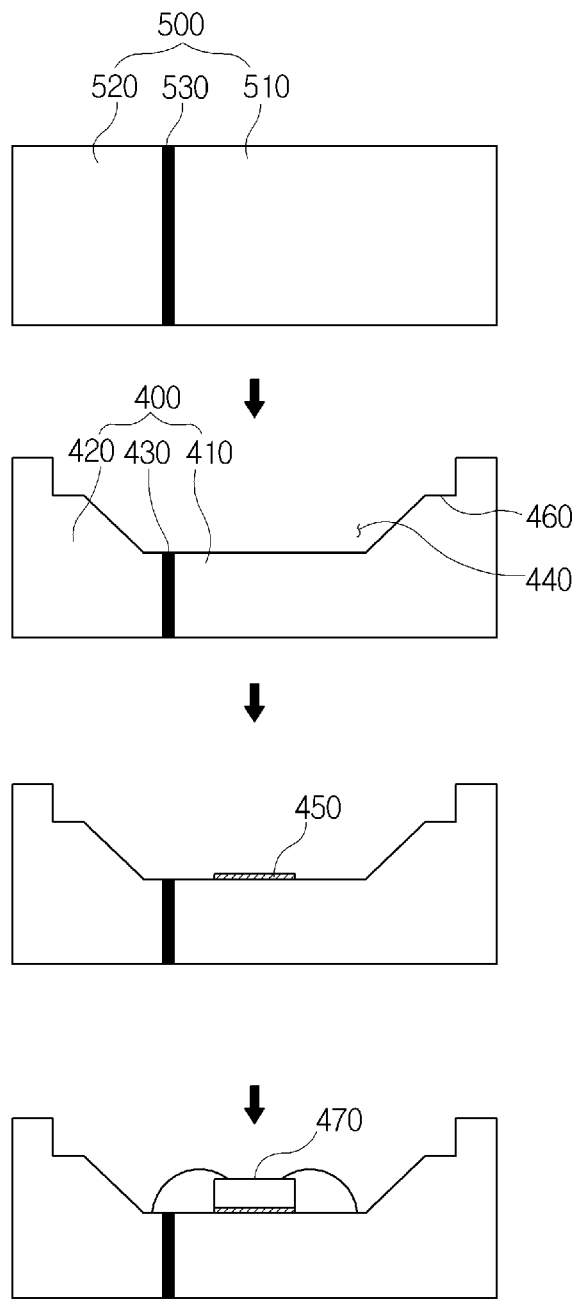
[Fig. 24]

[Fig. 25]
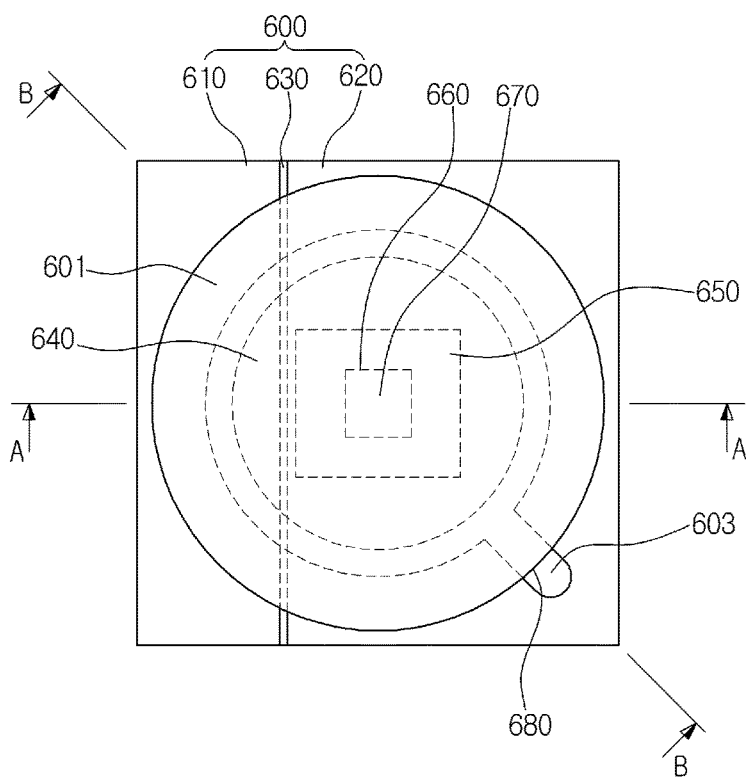
[Fig. 26]
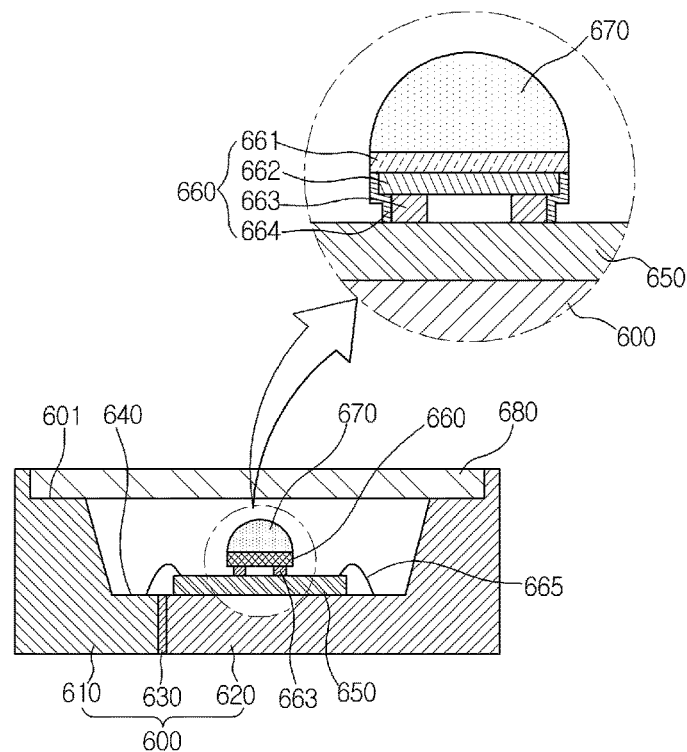

[Fig. 27a]
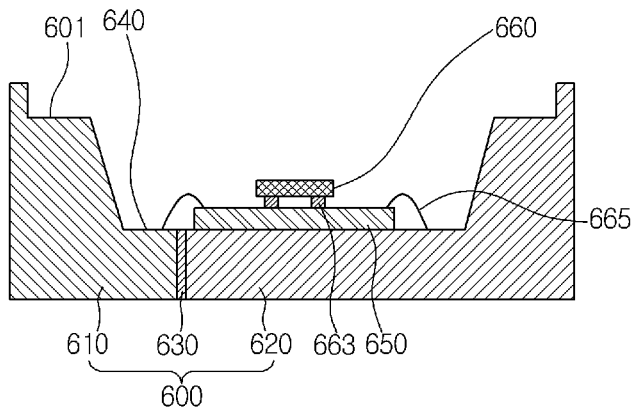
[Fig. 27b]
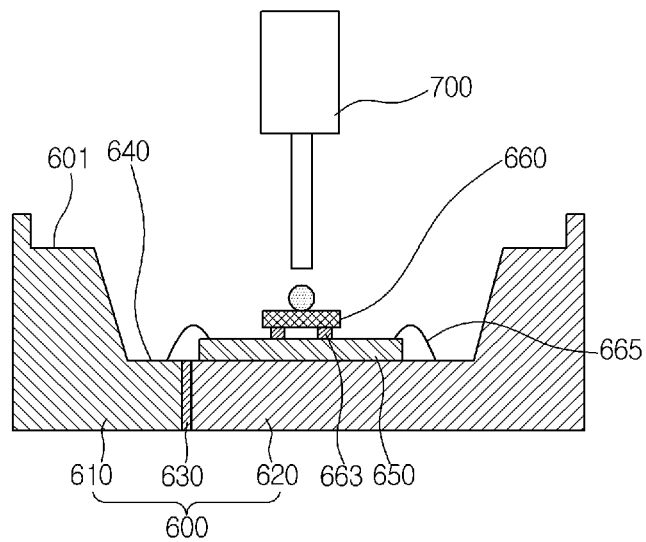
[Fig. 27c]
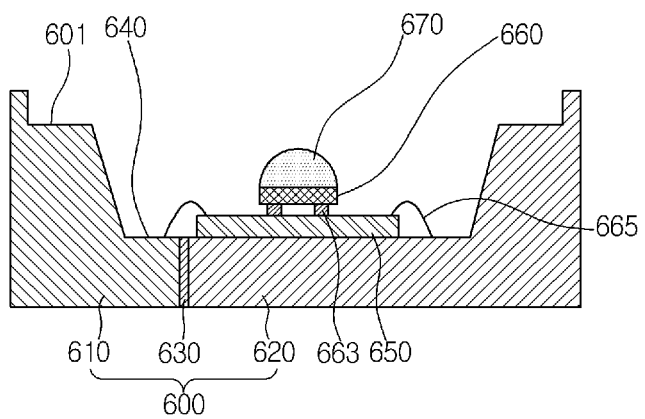

[Fig. 27d]
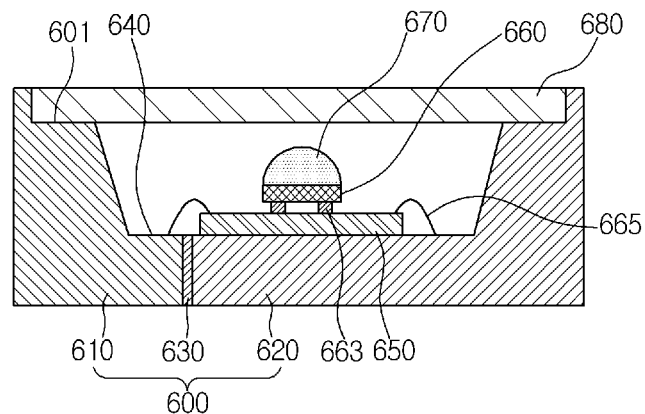
[Fig. 28]
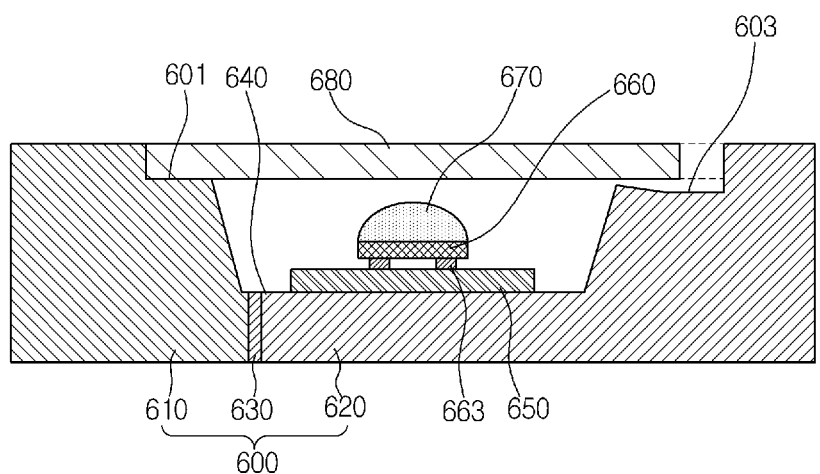
[Fig. 29]
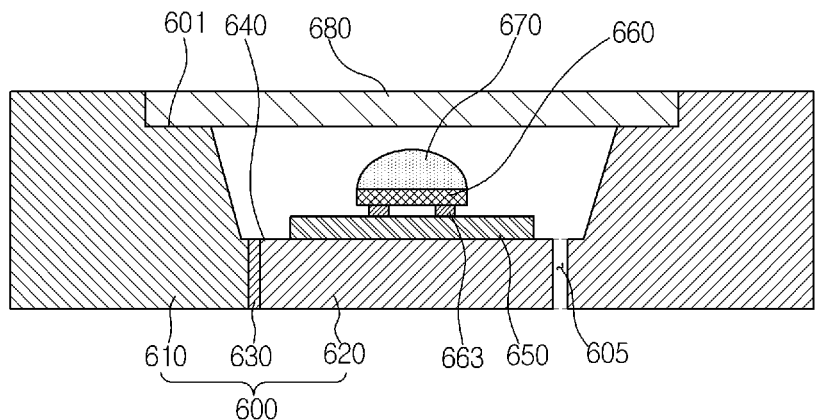

[Fig. 30]
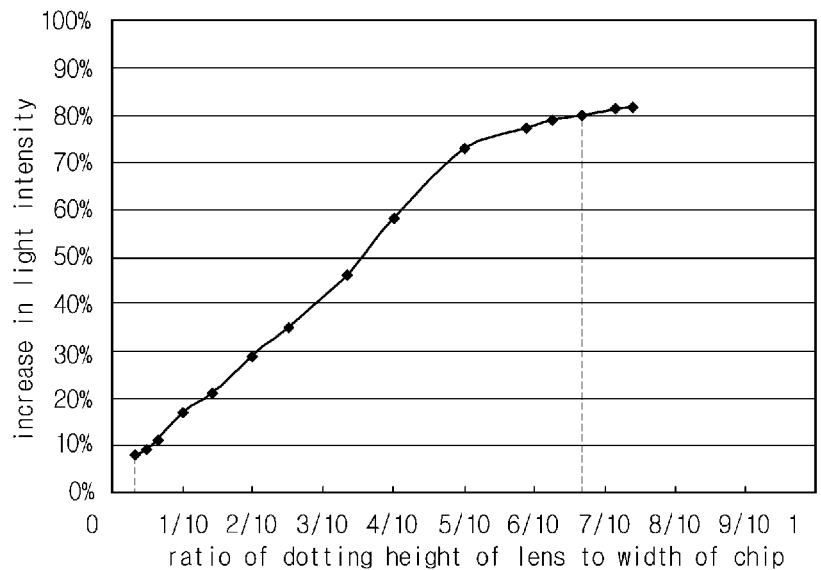
[Fig. 31]
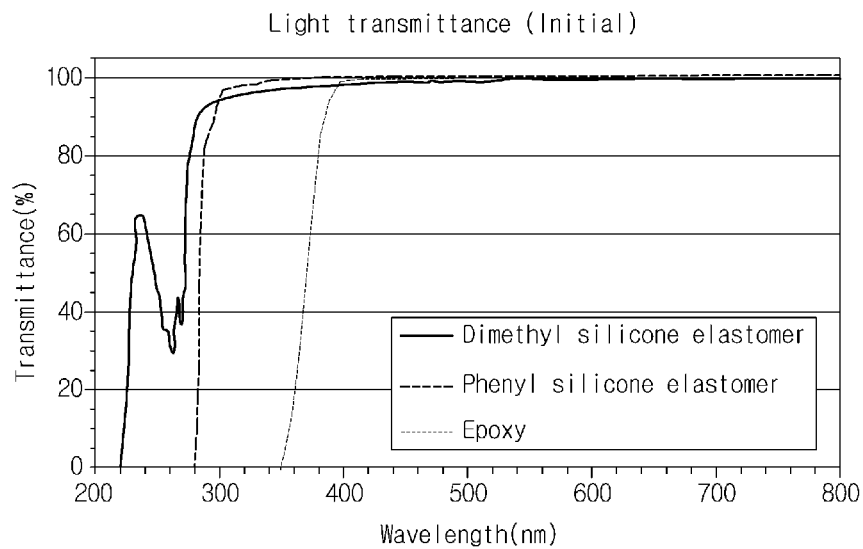

[Fig. 32]
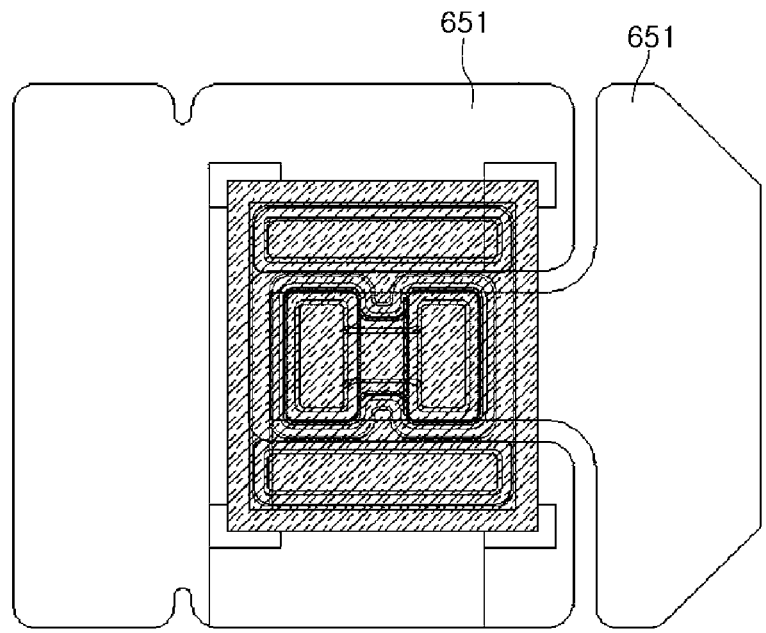
[Fig. 33a]
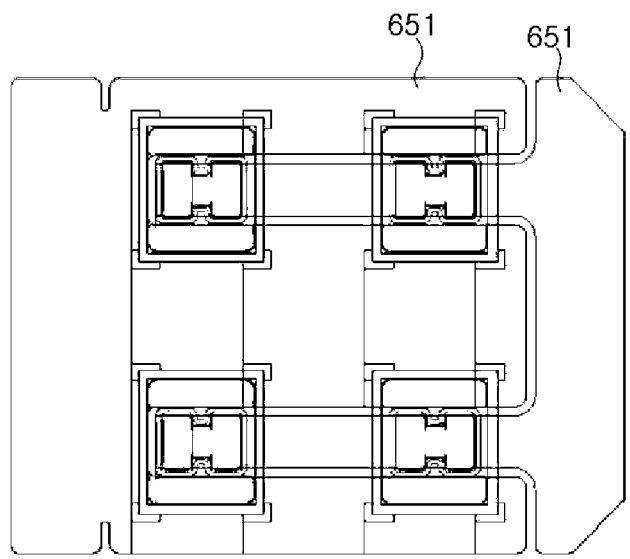

[Fig. 33b]
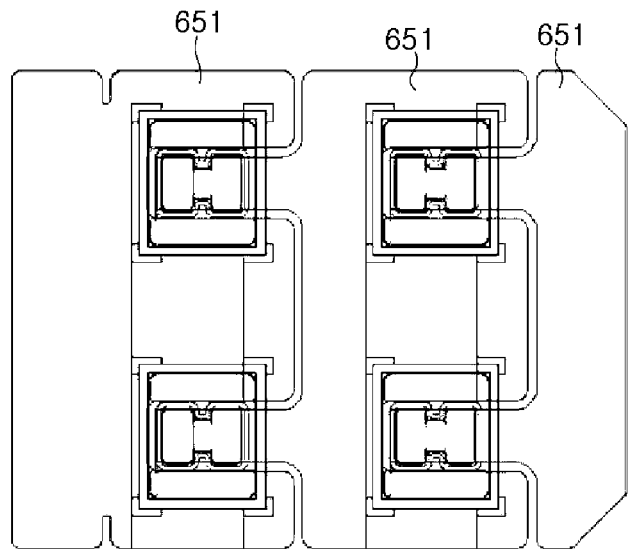
[Fig. 33c]
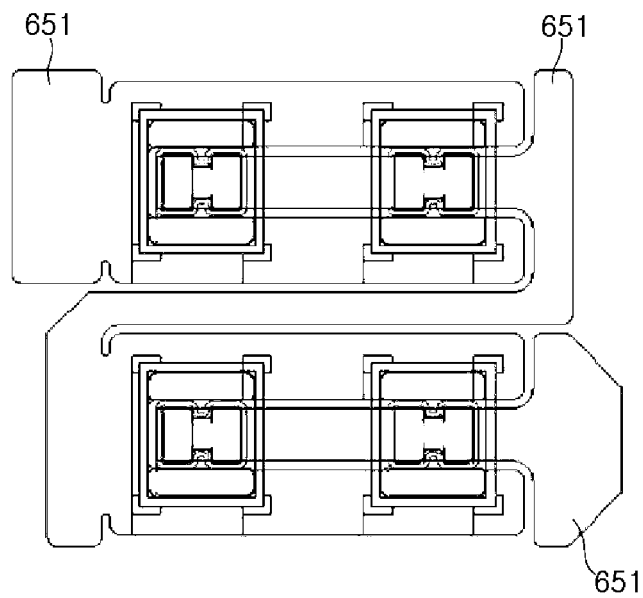

[Fig. 33d]
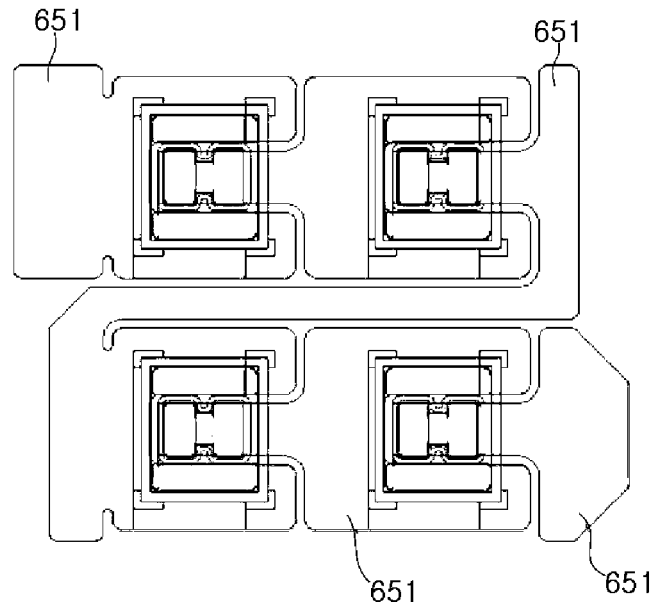
[Fig. 34]
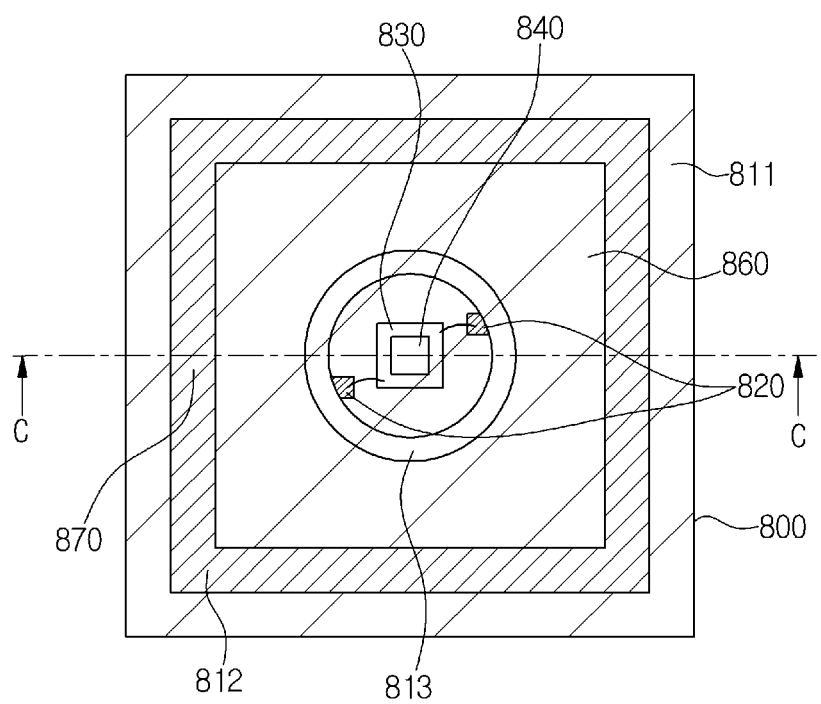

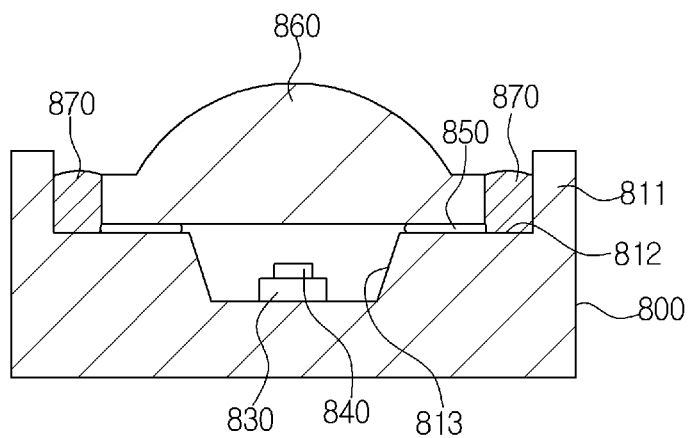
[Fig. 35]
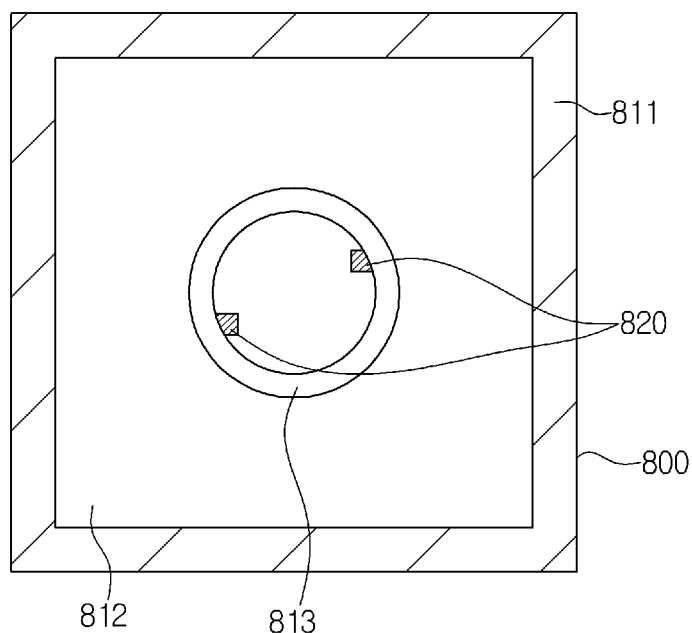
[Fig. 36]

[Fig. 37]
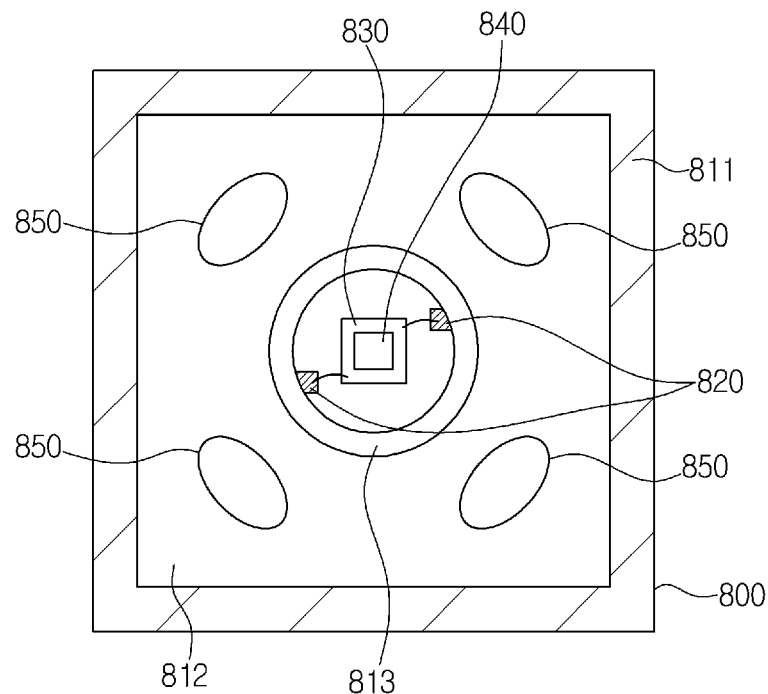
[Fig. 38]
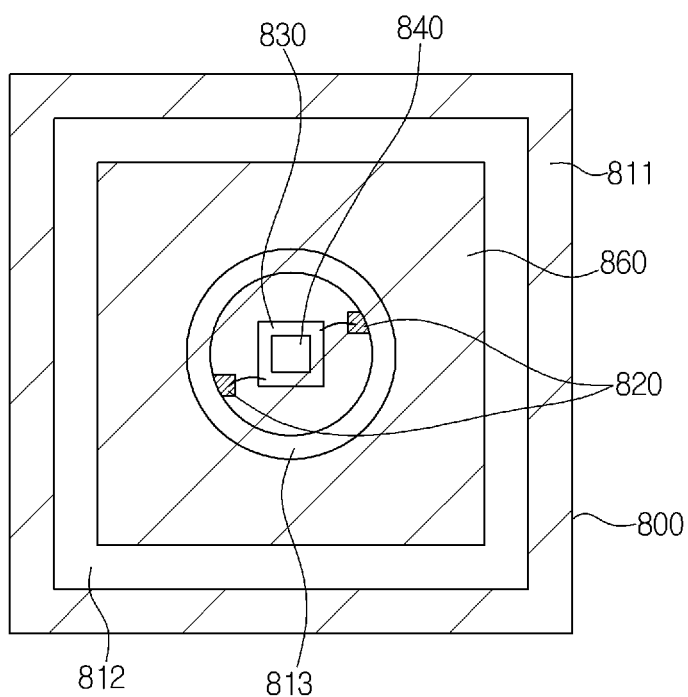

LIGHT-EMITTING DEVICE AND METHOD OF MANUFACTURING THE SAME

CROSS-REFERENCE TO RELATED APPLICATIONS

This application is a continuation of U.S. patent application Ser. No. 14/002,966, filed on Sep. 3, 2013 which is the National Stage entry of International Application No. PCT/KR2013/001739, filed on Mar. 5, 2013, and claims priority from and the benefit of Korean Patent Application No. 10-2012-0022476, filed on Mar. 5, 2012, Korean Patent Application No. 10-2012-0024644, filed on Mar. 9, 2012, Korean Patent Application No. 10-2012-0024700, filed on Mar. 9, 2012, and Korean Patent Application No. 10-2013-0002435, filed on Jan. 9, 2013, all of which are hereby incorporated by reference for all purposes as if fully set forth herein.

BACKGROUND

Field

The present invention relates to a light-emitting device comprising a light-emitting device and a manufacturing method thereof.

Discussion

Light-emitting devices fabricated as individual chips are packaged so that they are electrically connected to printed circuit boards, power supplies or control means. When a chip is packaged, it is protected from the external environment, and its electrical connection with an external terminal is achieved smoothly. In particular, a light-emitting device functions to allow the light generated by supply of electric power to be easily emitted to the outside and also functions to allow the heat generated to be dissipated to the outside.

With the recent advancement of technologies for the formation of compound semiconductor single crystals and the control of dopants, high-output light-emitting devices have been realized. The realization of high output of light-emitting devices requires high power supply and causes problems associated with the dissipation of the heat generated.

Particularly, when the heat generated in a light-emitting device is not smoothly dissipated to the outside, it may result in the deterioration of the light-emitting device. In an attempt to solve this problem, ceramic materials or metals have recently been used as package materials.

Ceramic materials have the advantage of blocking external heat, because they have low heat transfer properties. However, these ceramic materials have a problem in that they do not easily dissipate the heat generated in packages. In addition, the ceramic materials have a problem in that a separate reflective material needs to be provided below a light-emitting chip so that the light generated in packages is easily emitted to the outside.

The use of a metal material as a package material has an advantage in that high heat transfer properties can be ensured. However, the use of a polymer material as a molding material makes it difficult to ensure heat dissipation properties, even when a frame made of a metal material is used.

FIG. 1 is a cross-sectional view showing a light-emitting device according to the prior art.

Referring to FIG. 1, the light-emitting device according to the prior art has a frame 1, a molded portion 3, a chip mounting portion 5 and a lens portion 7.

The frame 1 is made of a metal material, and the molded portion 3 is provided on the peripheral portion of the frame 1. The molded portion 3 forms the sidewall of the light-emitting device and extends vertically. The molded portion 3 includes a polymer material different from the metal material forming the frame 1.

Also, the chip mounting portion 5 is provided in the internal space defined by the surface of the frame 1 and the molded portion 3. The chip mounting portion 5 may be a chip or a chip-mounted substrate. The chip mounting portion 5 is electrically connected to the frame 1 by wire bonding or surface mounting.

Further, the lens portion 7 is provided on the upper end of the molded portion 3. The lens portion 7 is made of a transparent material and bonded to the molded portion 3.

The above-described configuration has a problem in that, because the molded portion 3 forming the sidewall of the light-emitting device cannot easily dissipate the heat generated in the package, the heat transfer properties of the light-emitting device are deteriorated. Moreover, the decrease in heat transfer to the outside leads to deterioration in the light emitting properties of the light-emitting chip. In addition, because the molded portion 3 forming the sidewall of the package is made of a black polymer material, it cannot sufficiently reflect the light emitted.

Particularly, when the light-emitting device emits light in the ultraviolet region, the light reflecting properties of the package will be deteriorated due to the frame 1 made of a metal material or the molded portion 3 made of a black polymer material, and the reliability of the light emitting device will be deteriorated due to the low heat transfer properties of the package. In addition, when heat is generated in the light-emitting device, the lens portion 7 can be detached from the molded portion 3, because it is made of a material having an expansion coefficient different from that of the molded portion 7.

Additionally, if the frame 1 is completely made of a metal such as Al in order to increase the reflectivity, a chip or a submount is mounted on the frame 1 using an Ag paste containing an organic material such as epoxy or silicone, because soldering is impossible as a Sn-based solder is not bonded onto the Al frame.

However, when the chip or the submount is mounted using the Ag paste containing the organic material as described above, the organic material will be influenced by the light (particularly UV light) from the chip for a long period of time, and thus the Ag paste will be delaminated from the frame 1, or the chip or the submount will be delaminated from the Ag paste, resulting in deterioration in the reliability of the device.

In addition, a conventional surface-mount device (SMD) type ceramic package having a cavity is manufactured by mounting a light-emitting device in the cavity, and then bonding a window-type or hemisphere-type glass lens directly to the upper end of the cavity. Alternatively, instead of placing the glass lens on the upper end of the cavity, a polymer such as a fluoropolymer or a silica-based polymer is injected into the cavity by a molding process so as to function as a lens while protecting the light-emitting device.

However, the conventional ceramic package comprising the glass lens placed directly on the upper end of the cavity is not satisfactory in terms of optical efficiency and light intensity, because light extraction is performed through the lens spaced away from the light-emitting device. Moreover, the ceramic package comprising the polymer lens filled in the cavity in place of the glass lens has a shortcoming in that the light transmittance is somewhat low, because the thickness of the polymer is inevitably thick. Particularly, in the case of light-emitting devices that emit UV C light (deep UV light), the optical efficiency is significantly reduced as the thickness of the polymer becomes thicker.

Further, in the case of STEM packages, a lens-integrated cap is bonded to a head by eutectic bonding to protect the light-emitting device. However, the STEM packages are not difficult to produce using automatic systems, and thus cannot be produced in large amounts. In addition, because the package surface is plated with Au having low reflectivity, a relatively low light intensity is shown even when the same light-emitting device is applied.

In recent years, in order to solve the costly problem of conventional STEM packages, which results from high material costs and production costs, there have been attempts to use inexpensive packages such as ceramic packages or general plastic packages as LED packages for UV light.

For example, a lens can be attached to a package body using an adhesive after mounting a LED in the cavity of the package body. The cavity is sealed with the adhesive so as to prevent water from penetrating from the outside. The cavity is closed by the package body, the lens and the adhesive, and thus the penetration of external water and the like into the cavity is prevented. However, during the attachment of the lens, the lens can be detached from the package body by compressed air produced in the cavity, thus causing adhesion failure. For example, when the lens is pressed against the package body using a lens holder with the adhesive interposed therebetween, compressed air is produced in the cavity. When the lens holder is removed, the lens can be detached from the package body by the compressed air. In addition, during curing of the adhesive, air in the cavity can be expanded, and the lens can be detached from the package body due to an increase in air pressure in the cavity.

SUMMARY

The present invention has been made in order to solve the above-described problems occurring in the prior art, and it is an object of the present invention to provide a light-emitting device having improved thermal properties and electrical connection properties.

Another object of the present invention is to provide a method for manufacturing a light-emitting device having improved thermal properties and electrical connection properties.

Still another object of the present invention is to provide an optical device substrate and a light-emitting device, wherein a bonding aid layer is formed in a chip-mounting region of a frame portion for mounting a light-emitting device such that soldering or reflow by a Sn-based solder is possible.

Still another object of the present invention is to provide a light-emitting device which has high light extraction efficiency and light intensity, can be manufactured with high productivity and can safely protect a light-emitting device.

Still another object of the present invention is to provide a light-emitting device and a manufacturing method thereof, which can prevent the penetration of water from the outside and the adhesion failure of a lens.

Yet another object of the present invention is to provide a light-emitting device and a manufacturing method thereof, which can prevent the loss of light emitted from a light-emitting device and the penetration of water from the outside.

To achieve the above object, in accordance with one aspect of the present invention, there is provided a light-emitting device comprising: a frame portion having a bottom and a sidewall, which are integrally formed of a metal material; a light-emitting portion which is disposed on the frame portion and emits ultraviolet light; a buffer portion disposed at the upper end of the sidewall of the frame portion; and a window portion disposed on the buffer portion.

In the light-emitting device, the frame portion comprises: an insulating separation layer; a first frame disposed on one side of the insulating separation layer and having a bottom and a sidewall, which are integrally formed of a metal material; and a second frame disposed on the other side of the insulating separation layer and having a bottom and a sidewall, which are integrally formed of the same metal material as the first frame; wherein the first and second frames form the bottom and sidewall of the light-emitting device, and the insulating separation layer serves to electrically insulate the first frame and the second frame.

Herein, the first frame includes aluminum or an aluminum alloy.

Also, the window portion includes quartz.

Moreover, the buffer portion has a Shore D hardness of 10-60.

In addition, the buffer portion has an elongation of 70-300%.

The first frame has a first contact portion, which is wire-bonded with the light-emitting portion and has a surface roughness different from that of the first frame, and the second frame has a second contact portion, which is wire-bonded with the light-emitting portion and has a surface roughness different from that of the second frame.

Also, the first contact portion is depressed from the surface of the first frame, and the second contact portion is depressed from the surface of the second frame.

Moreover, the first contact portion has a lower surface roughness than that of the first frame, and the second contact portion has a lower surface roughness than that of the second frame.

In addition, the first frame or the second frame includes a step portion for receiving the window portion.

Herein, the first frame or the second frame has a through-hole that connects an external space of the light-emitting device with an internal space defined by the window portion and the frame portion.

The through-hole penetrates the bottom portion of the frame portion.

Also, the first frame or the second frame has a through-hole that connects an external space of the light-emitting device with an internal space defined by the window portion and the frame portion.

The through-hole penetrates the bottom of the frame portion.

In accordance with another aspect of the present invention, there is provided a method for manufacturing a light-emitting device, the method comprising the steps of: bonding a first metal layer, an insulating layer and a second metal layer to each other in a first direction; partially removing the first metal layer, the insulating layer and the second metal layer in a second direction perpendicular to the first direction to form a first frame, a second frame and an insulating separation layer; mounting a light-emitting portion on the first frame and wire-bonding the light-emitting portion; and bonding a window portion to the first frame and the second frame using a buffer portion.

In the method of the present invention, the sidewall of each of the first frame and the second frame remains, and the first frame and the second frame are partially removed in the second direction.

The method of the present invention further comprises, after the step of partially removing the first metal layer, forming a first contact portion and a second contact portion, which are depressed from surfaces of the first frame and the second frame, respectively.

In the method of the present invention, the wire bonding is carried out on the first contact portion and the second contact portion.

In accordance with still another aspect of the present invention, there is provided a substrate for an optical device, comprising: a frame portion having a depressed portion formed thereon; a chip-mounting region formed in a predetermined region of the bottom surface of the depressed portion; and a first bonding aid layer formed on at least a portion of the chip-mounting region.

In the substrate for the optical device, the frame portion has a first frame and a second frame, which are spaced apart from each other by an insulating separation layer.

Herein, the frame portion is formed of aluminum or an aluminum alloy.

The insulating separation layer is formed so as to deviate from the chip-mounting region.

Further, the first frame is formed to have a larger width than the second frame.

The chip-mounting region is formed on the first frame.

Also, the first bonding aid layer is formed on the first frame.

Herein, the first bonding aid layer is formed of a material having better wettability to the frame portion than that of the bonding layer.

Also, the first bonding aid layer is formed of any one selected from among Ni/Ag, Ni/Au, and Cu.

In the substrate for the optical device, the depressed portion comprises a step portion at the upper end of the sidewall thereof.

Also, a second bonding aid layer is formed on the step portion.

Herein, the second bonding aid layer is formed of the same material as the first bonding aid layer.

In accordance with still another aspect of the present invention, there is provided a light-emitting device comprising: a frame portion comprising a chip-mounting region thereon; a light-emitting device mounted on at least a portion of the chip-mounting region with a bonding layer interposed therebetween; and a first bonding aid layer formed between the bonding layer and the frame portion.

Herein, the frame portion is formed of aluminum or an aluminum alloy.

Also, the frame portion comprises a first frame and a second frame, which are spaced apart from each other.

Herein, the first frame is spaced apart from the second frame by an insulating separation layer.

Also, the insulating separation layer is formed so as to deviate from the chip-mounting region.

Further, the first frame is formed to have a larger width than that of the second frame.

Herein, the chip-mounting region is formed on the first frame.

Also, the bonding layer is formed of Sn or a Sn alloy.

Further, the first bonding aid layer is formed on the first frame.

Herein, the first bonding aid layer is formed of a material having better wettability to the frame portion than that of the bonding layer.

The first bonding aid layer is formed of any one selected from among Ni/Ag, Ni/Au, and Cu.

Also, the frame portion comprises a depressed portion in the upper surfaced thereof, and the depressed portion includes the chip-mounting region on the bottom thereof.

Herein, the depressed portion comprises a step portion at the upper end of the sidewall thereof.

Herein, the step portion comprises a second bonding aid layer thereon.

Herein, the second bonding aid layer is formed of the same material as that of the first bonding aid layer.

In accordance with yet another aspect of the present invention, there is provided a light-emitting device comprising: a light-emitting chip; a frame portion on which the light-emitting chip is mounted; and a lens disposed on the light-emitting chip.

Herein, the lens is formed to have a height corresponding to $1/30$ to $20/30$ of the width of the light-emitting chip.

The lens includes a silicone material.

Also, the lens has a thixotropic index of 0.8-7.

Herein, the light-emitting chip is a UV light-emitting chip, and the silicone is dimethyl-type silicone.

Also, the light-emitting chip is a flip chip.

Further, the light-emitting chip comprises an epitaxial layer, a substrate disposed over the epitaxial layer, and a bump disposed below the epitaxial layer.

Also, the substrate is a sapphire substrate.

Further, the light-emitting chip further comprises an insulating layer surrounding around the epitaxial layer and the bump.

Herein, the insulating layer serves to reflect light emitted from the epitaxial layer.

Also, a hole cup for receiving the light-emitting chip is formed in the upper surface of the frame portion.

The light-emitting device further comprises a window portion covering the hole cup.

Herein, the frame portion further comprises a step portion formed so as to engage the circumference of the window portion.

Also, an air passage groove is formed at a predetermined location of the bottom surface of the step portion so as to cross the bottom of the step portion and extend outward from the step portion.

Herein, the air passage groove comprises a slope portion inclined downward toward the outside.

Also, an air passage hole is formed through the frame portion so as to extend from the hole cup to the lower surface of the frame portion.

Herein, the frame portion comprises a first frame, a second frame disposed with a gap from the first frame, and an insulating separation layer provided in the gap.

Also, the first and second frames are made of a conductive material.

Herein, the first and second frames are made of aluminum.

Also, the hole cup for receiving the light-emitting chip is formed in the upper surface of the frame portion in such a manner that the insulating separation layer crosses the hole cup.

Further, a submount on which the light-emitting chip is mounted is provided in the hole cup portion formed on the second frame.

Moreover, the light-emitting device comprises a plurality of light-emitting chips, and a plurality of submounts on which the plurality of light-emitting chips are respectively mounted are provided on the frame portion.

Herein, the plurality of submounts comprise a plurality of electrode connecting members which are spaced apart from each other such that the plurality of light-emitting chips are connected to each other in series, in parallel or in a combination of serial and parallel.

Herein, the lens is formed by a dotting method.

In accordance with yet another aspect of the present invention, there is provided a light-emitting device comprising: a frame portion having a cavity; a light-emitting device mounted in the cavity; a window portion which covers the cavity and transmits light emitted from the light-emitting device; an adhesive located between the window portion and the frame portion to bond the window portion to the frame portion; and a sealing material provided along the circumference of the window portion to seal a space between the window portion and the frame portion.

Herein, the frame portion comprises an outer wall forming the outer circumference thereof, and the sealing material serves to seal between the outer wall of the frame portion and the edge of the window portion.

Also, the adhesive is located around the cavity in such a manner that a passage is formed between the window portion and the frame portion and is blocked by the sealing material.

Herein, the window portion is a flat sheet, a hemispherical lens or a spherical lens.

In addition, the light-emitting device further comprises a submount substrate, and the light-emitting device is flip-bonded onto the submount substrate.

Herein, the light-emitting device emits UV light having a wavelength of 250-365 nm.

Also, the adhesive includes silicone resin.

Moreover, the sealing material includes epoxy.

In accordance with yet another aspect of the present invention, there is provided a method for manufacturing a light-emitting device, the method comprising: preparing a frame portion having a cavity; mounting a light-emitting device in the cavity of the frame portion; attaching a window portion to the frame portion by an adhesive so as to cover the cavity; and providing a sealing material along the circumference of the window portion to seal a space between the window portion and the frame portion.

Herein, when the window portion is attached by the adhesive, an air discharge passage remains between the window portion and the frame portion.

Also, the air discharge passage is blocked by the sealing material.

The adhesive includes silicone resin.

In addition, the sealing material includes epoxy.

BRIEF DESCRIPTION OF THE DRAWINGS

FIG. 1 is a cross-sectional view showing a light-emitting device according to the prior art.

FIG. 2 is a cross-sectional view showing a light-emitting device according to one embodiment of the present invention.

FIG. 3 is a cross-sectional view showing another embodiment of the light-emitting device shown in FIG. 2.

FIG. 4 is another cross-sectional view showing a light-emitting device according to one embodiment of the present invention.

FIG. 5 is a cross-sectional view showing another embodiment of the light-emitting device shown in FIG. 4.

FIG. 6 is a top view showing the light-emitting device shown in FIG. 4.

FIG. 7 is a cross-sectional view showing a contact portion on a frame portion in the light-emitting device shown each of FIGS. 2 to 5.

FIG. 8 is a cross-sectional view showing a portion of a light-emitting device according to another embodiment of the present invention.

FIGS. 9a, 9b, and 9c are top views and equivalent circuit diagrams, which show various examples of the light-emitting portion shown in FIG. 8.

FIG. 10 is a cross-sectional view illustrating a first metal layer, a second metal layer, and an insulating layer useful for manufacturing the light-emitting device of FIGS. 2, 3, 4, and 5.

FIGS. 11, and 12 are cross-sectional views illustrating a method for manufacturing the light-emitting device of FIG. 2 according to one embodiment of the present invention.

FIGS. 13 and 14 are cross-sectional views illustrating a method for manufacturing the light-emitting device of FIG. 3 according to one embodiment of the present invention.

FIGS. 15 and 16 are cross-sectional views illustrating a method for manufacturing the light-emitting device of FIG. 4 according to one embodiment of the present invention.

FIGS. 17 and 18 are cross-sectional views illustrating a method for manufacturing the light-emitting device of FIG. 5 according to one embodiment of the present invention.

FIG. 19 is a perspective view of a substrate for an optical device according to another embodiment of the present invention.

FIG. 20 is a cross-sectional view of the substrate shown in FIG. 19.

FIG. 21 shows the state of use of a light-emitting device comprising the optical device substrate of FIG. 19 according to another embodiment of the present invention.

FIG. 22 is a cross-sectional view showing a second bonding aid layer formed on a step portion according to another embodiment of the present invention.

FIG. 23 is a process diagram sequentially showing a method for manufacturing the light-emitting device of FIG. 21 according to another embodiment of the present invention.

FIG. 24 is a process diagram sequentially showing another method for manufacturing the light-emitting device of FIG. 21.

FIG. 25 is a top view of a light-emitting device according to another embodiment of the present invention.

FIG. 26 is a cross-sectional view taken along line A-A of FIG. 25.

FIGS. 27a, 27b, 27c, and 27d are conceptual views illustrating a method for making a lens for a light-emitting device according to another embodiment of the present invention.

FIG. 28 is a cross-sectional view taken along line B-B of FIG. 1, which shows an air passage groove in a light-emitting device according to another embodiment of the present invention.

FIG. 29 is a schematic cross-sectional view illustrating an air passage groove in a light-emitting device according to another embodiment of the present invention.

FIG. 30 is a graphic diagram showing an increase (%) in light intensity as a function of the ratio of the lens height to the width of a light-emitting chip.

FIG. 31 is a graphic diagram showing the light transmittance of each of dimethyl type silicone, phenyl type silicone and epoxy as a function of wavelength.

FIG. 32 is a schematic top view showing the structure of a submount on which a light-emitting chip is mounted.

FIGS. 33a, 33b, 33c, and 33d are schematic top views showing the structure of a submount on which a plurality of light-emitting chips are mounted.

FIG. 34 is a top view showing a light-emitting device according to another embodiment of the present invention.

FIG. 35 is a cross-sectional view taken along line C-C of FIG. 34.

FIGS. 36, 37, and 38 are top views showing a method for manufacturing a light-emitting device according to another embodiment of the present invention.

DETAILED DESCRIPTION OF THE ILLUSTRATED EMBODIMENTS

Hereinafter, preferred embodiments of the present invention will be described in further detail with reference to the accompanying drawings. However, the present invention is not limited to the embodiments described herein and can also be embodied in other forms.

It is to be noted that when a layer is referred to as being "on" another layer or substrate in the specification, it can be formed directly on the other layer or substrate, or a third layer can be interposed therebetween. Also, terms with directional connotations such as upward, downward, above, below, upper surface and lower surface are used in context for purposes of relative positions and are not intended to refer to absolute directions.

It should be understood that "first", "second" or "third" in the embodiments is not intended to limit elements and is merely used to distinguish one element from another element.

In the drawings, the thickness of layers and regions may be exaggerated for clarity. Like numbers refer to like elements throughout the specification.

The light-emitting device in the specification may be a light-emitting diode (LED), but is not limited thereto. When the light-emitting device is the light-emitting diode, the light-emitting diode may be, for example, any one of colored light-emitting diodes that emit red, green or blue light, white light-emitting diodes that emit white light, and UV (ultraviolet) light-emitting diodes that emit UV light, but is not limited thereto.

Embodiments

FIG. 2 is a cross-sectional view showing a light-emitting device according to an embodiment of the present invention.

Referring to FIG. 2, the light-emitting device according to this embodiment comprises a frame portion 100, an electrode portion 120, a light-emitting portion 140, a buffer portion 160 and a window portion 180.

The frame portion 100 has a first frame 101, a second frame 103 and an insulating separation layer 105. The frame portion 100 has a depressed central portion. Thus, the internal space defined by the frame 100 includes a light-emitting portion 140, and the light-emitting portion 140 is sealed by the buffer portion 160 and the window portion 180. Thus, the frame portion 100 defines the bottom and sidewall of the light-emitting device.

The first frame 101 is made of a metal material and preferably has aluminum or an aluminum alloy. The light-emitting portion 140 is provided on the first frame 101. Also, the first frame 101 forms the bottom and sidewall of the light-emitting device. In other words, the first frame 101 forms the side that extends approximately perpendicular from the flat bottom surface and is formed integrally with the bottom. This means that the sidewall of the first frame 101 is provided approximately perpendicular to the bottom without any welding or bonding means.

The second frame 103 is provided at a location opposite to the first frame 101 with respect to the insulating separation layer 105. The second frame 103 is made of a metal material, preferably the same material as that of the first frame 101. Thus, the second frame 103 may include aluminum or an aluminum alloy. Also, the second frame 103 forms the bottom and sidewall of the light-emitting device. It is provided integrally with the bottom so as to extend approximately perpendicular from the flat bottom surface. It means that the sidewall of the second frame 103 is provided approximately perpendicular to the bottom without any welding or bonding means.

Further, although the sidewall of each of the first frame 101 and the second frame 103 is shown to be approximately perpendicular to the bottom of the light-emitting device, it may also be provided to slop in some embodiments such that they effectively reflect light.

Between the first frame 101 and the second frame 103, there is provided the insulating separation layer 105. The insulating separation layer 105 may be made of any material that maintains the adhesion between the first frame 101 and the second frame 103 and has insulating properties. The insulating separation layer 105 provides electrical insulation between the first frame 101 and the second frame 103.

The electrode portion 120 comprises a first electrode 121 and a second electrode 123. The first electrode 121 is formed below the first frame 101, and the second electrode 123 is formed below the second frame 103. Further, each of the electrodes may include Ni/Ag or Ni/Au. For example, the first electrode 121 includes Ni, and the second electrode 123 includes Ag or Au. In other words, the first electrode 121 may include a stack of Ni/Ag, and the second electrode 123 may include a stack of Ni/Ag or Au.

The light-emitting portion 140 is provide on the first frame 101 and may be in the form of a diced individual chip, a plurality of chips connected by metal wiring, or a surface-mounted chip. The light-emitting portion 140 is electrically connected to the first frame 101 and the second frame 103 by bonding wires 111 and 112, respectively.

A first contact portion 106 is formed on the first frame 101 and is wire-bonded, and a second contact portion 108 is formed on the second frame 103 and is wire-bonded. The first contact portion 106 has a roughness different from that of the surface of the first frame 101. For example, the first contact portion 106 has a lower roughness than the surface of the first frame 101. Also, the second contact portion 108 has a roughness different from that of the surface of the second frame 103. Preferably, the second contact frame 108 has a lower roughness than the surface of the second frame 103.

Formation of each of the contact portions having a roughness different from that of each frame can be achieved by the use of a chemical or mechanical method.

As the chemical methods, a cleaning process for the frame surface corresponding to each of the contact portions may be used. For example, an etching process employing an etching solution may be used. As the mechanical method, an abrasion process or surface planarization process for the frame surface may be used. The abrasion process may be drilling, and the surface planarization process may be chemical mechanical polishing.

If the contact portion is formed by the use of the mechanical method, the contact portion may be provided so as to be depressed from the surface of the frame.

A metal material for wire bonding is connected to the first frame 101 and the second frame 103 on the first contact portion 106 and the second contact portion 108 by wire bonding.

The buffer portion 160 is provided on the first frame 101 and the second frame 102, which are provided perpendicularly from the bottom surface to form the sidewall of the light-emitting device. Through the buffer portion 160, the window portion 180 is bonded. Thus, the buffer portion 160 is required to have an adhesive property. Also, the window portion 160 is required to have a thermal expansion coefficient suitable for preventing the window portion 180 from being detached due to the difference in thermal expansion coefficient between the frame portion 100 and the window portion 180.

Further, the buffer portion 160 is preferably made of a soft material and preferably has a Shore D hardness of 10-60. If the Shore D hardness of the buffer portion 160 is higher than 60, the buffer portion 160 made of an adhesive polymer material will be damaged due to the difference in thermal expansion coefficient between the window portion 180 made of quartz and the frame portion 100 made of aluminum. If the Shore D hardness of the buffer portion 160 is lower than 10, the buffer portion will not have a sufficient adhesive property due to its low hardness.

Moreover, the buffer portion 160 is required to have an elongation in a specific range. When the buffer portion 160 is applied between the window portion 180 made of quartz and the frame portion 100 made of aluminum, the buffer portion 160 preferably has an elongation of 70-300%. If the elongation of the buffer portion 160 is less than 70%, the buffer portion 160 will be delaminated from quartz or aluminum due to the difference in thermal expansion coefficient therefrom. If the elongation of the buffer portion 160 is more than 300%, the fluidity of the buffer portion 160 made of a polymer material will increase, and thus the buffer portion 160 cannot provide sufficient adhesion.

Examples of the material for the buffer portion 160, which satisfies the above-described requirements, include organic or inorganic adhesive polymers, including urethane, epoxy, acrylic and silicone polymers. As used herein, the term "silicone polymer" refers to a polymer adhesive containing a silicon atom. In other words, the silicone polymer refers to a polymer material wherein an organic group-containing silicone and oxygen are chemically bonded to each other. In addition, the silicone polymer may refer to a silane-based polymer material or a resin-based polymer material. The material for the buffer portion 160 may be chosen according to the choice of the material for the frames 101 and 103 and the material for the window portion 180.

For example, the buffer portion may have an elastomer such as a chemically crosslinked copolymer, a graft copolymer or an ionically crosslinked copolymer.

Also, the buffer portion may comprise Kovar. Kovar is a nickel alloy containing iron and cobalt. Particularly, when Kovar is bonded to glass, the difference in thermal expansion coefficient from the glass is insignificant, and thus the bonding with the glass is prevented from being broken due to a change in temperature. However, the buffer portion made of Kovar has a thickness larger than one made of a silicone polymer. Where the light-emitting portion emits light in the UV wavelength region, shortening the distance between the window portion and the light-emitting portion can be advantageous in terms of the structure of the light-emitting device. As described above, the buffer portion can be suitably selected in consideration of the materials of the surrounding elements so as to satisfy the above-described elongation and hardness.

The window portion 180 is bonded to the frame portion 100 through the buffer portion 160. The window portion 180 is required to have a transparent material such that light emitted from the light-emitting portion 140 can be emitted to the outside. Thus, the window portion 180 comprises glass, quartz or sapphire.

In addition, a through-hole 109 may be formed through the first frame 101 or second frame 103 of the frame 100. The through-hole 109 penetrates the outer and inside of the light-emitting device. In other words, the internal space having the chip mounted therein is connected to the outside through the through-hole 109. Specifically, in the process in which the buffer portion 160 interposed between the frame portion 100 and the window portion 180 is cured, expanded air is discharged to the outside through the through-hole 109. Thus, the adhesive strength of the buffer portion can be maintained without damaging the shape of the buffer portion or the sealed state. Although it is shown in FIG. 2 that the through-hole 109 penetrates the sidewall of the first frame 101, the through-hole 109 may penetrate the second frame 103 in some embodiments. Also, the through-hole 109 may have any shape that extends from the outside of the light-emitting device to the internal space defined by the frame portion 100 and the window portion 180.

After the buffer portion has been cured, the package can be completely sealed by filling the through-hole with an adhesive in a subsequent process.

FIG. 3 is a cross-sectional view showing another embodiment of the light-emitting device shown in FIG. 2.

Referring to FIG. 3, the through-hole 109 penetrates the lower surface of the first frame 101 of the frame portion 100. Also, it is configured to penetrate the bottom of the first frame 101 and the electrode portion 120. It is to be understood that the through-hole 109 may also be formed to penetrate the bottom of the second frame 103 and the electrode portion 120 in some embodiments. The through-hole 109 shown in FIG. 3 serves to discharge expanded air to the outside during curing of the buffer portion 160. After the light-emitting device has been manufactured, it can be sealed when being mounted on a printed circuit board or the like.

Elements other than the through-hole 109 are as described for FIG. 2. Thus, with respect to the other elements, reference is made to the description of FIG. 2.

FIG. 4 is a cross-sectional view showing a light-emitting device according to still another embodiment of the present invention.

Referring to FIG. 4, the light-emitting device according to this embodiment comprises a frame portion 200, an electrode portion 220, a light-emitting portion 240, a buffer portion 260 and a window portion 280.

The frame portion 200 has a first frame 201, a second frame 203 and an insulating separation layer 205. The material of the first frame 201 is as described for FIGS. 2 and 3. However, the first frame 201 constitutes the bottom and sidewall of the package and has a step portion 210 at its upper portion. The step portion 210 defines a space for receiving the window portion 280. Thus, the buffer portion 260 is provided on the step portion 210. The buffer portion 260 is formed on the bottom and sidewall of the step portion 210 so that the contact area between the window portion 280 and the buffer portion 260 increases. The material and properties of the buffer portion 260 are as described for FIG. 2.

The same description applies to the second frame 203. In other words, the step portion 210 is also formed at the upper portion of the second frame 203, and the buffer portion 260 is formed on the bottom and sidewall of the step portion 210.

A through-hole 209 may be formed below the step portion 210 of the first frame 201. The through-hole 209 may be formed below the step portion 210 so as to penetrate the upper end of the first frame 201. In addition, as described above, the through-hole 209 may have any shape that connects the outside of the package with the internal space defined by the frame portion 200 and the window portion 280.

Thus, although it is shown in FIG. 4 that the through-hole 209 penetrates the first frame 201, the through-hole 209 may also have a structure that penetrates the second frame 203.

Furthermore, it is shown in FIG. 4 that the sidewall of each of the first frame 201 and the second frame 203, which define the internal space of the light-emitting device, has a slope shape. However, in addition to the slope shape, various shapes, including a shape perpendicular to the bottom, will also be possible in some embodiments.

Moreover, the materials and structures of the electrode portion 220, the light-emitting portion 240 and the window portion 280 in FIG. 4 are as described for FIGS. 2 and 3. For example, the electrode portion 220 comprises a first electrode 221 and a second electrode 223, wherein the first electrode 221 is provided below the first frame 201, and the second electrode 223 is provided below the second frame 203.

As shown in FIG. 4, a first contact portion 206 is provided on the first frame 201, and a second contact portion 208 is provided on the second frame 203. Each of the contact portions 206 and 208 is wire-bonded. In the wire bonding process, a bonding metal may be formed in contact with the bottom and sidewall of each of the contact portions 206 and 208. Thus, the contact area between the bonding wire and each of the frames 201 and 203 can increase. In addition, each of the contact portions 206 and 208 has a surface roughness different from that of each of the frames 201 and 203. Preferably, it has a surface roughness lower than the surface of the frames 201 and 203.

FIG. 5 is a cross-sectional view showing another embodiment of the light-emitting device of FIG. 4.

Referring to FIG. 5, the through-hole 209 formed through the frame portion 200 penetrates the bottom of the first frame 201. Specifically, it is configured to penetrate the bottom of the first frame 201 and the electrode portion 220. It is to be understood that the through-hole 209 may also penetrate the bottom of the second frame 203 and the electrode portion 220. The through-hole 209 shown in FIG. 5 serves to discharge expanded air to the outside during curing of the buffer portion 260. In addition, after the light-emitting device has been manufactured, it can be sealed when being mounted on a printed circuit board or the like.

Elements other than the through-hole 209 in FIG. 5 are as described for FIGS. 2 to 4. Thus, with respect to the other elements, reference is made to the description of FIGS. 2 to 4.

FIG. 6 is a top view of the light-emitting device shown in FIG. 4.

Referring to FIG. 6, the light-emitting device is approximately square in shape.

The frame portion 200 constitutes the outer peripheral portion of the light-emitting device.

Also, the frame portion 200 has the first frame 201 and the second frame 203 opposite to the first frame 201. Further, the insulating separation layer 205 is interposed between the first frame 201 and the second frame 203. In addition, the through-hole 209 is formed through the sidewall of the first frame 201.

The through-hole 209 connects the outside of the light-emitting device with the internal space defined by the frame portion 200 and the window portion 280.

A circular space is formed in the first frame 201 and the second frame 203, and the step portion 210 is formed along the circular portion. The window portion is provided on the step portion 210.

For the convenience of explanation and the ease of understanding by those skilled in the art, a light-emitting chip and a wire bonding portion that provides electrical connection with the chip are omitted in FIG. 6. These elements are as described in FIGS. 2 to 5.

FIG. 7 is a cross-sectional view showing the contact portion of the frame portion of the light-emitting device shown in FIGS. 2 to 5.

FIG. 7 shows the contact portion formed by the use of a mechanical method.

The first contact portion 206 is provided on the first frame 201 of the frame portion. The first contact portion 206 has a depressed shape when viewed from the side and an approximately circular shape when viewed from above.

When bonding wires 211 and 212 are used for electrical connection, a bonding metal is filled in the depressed portion. Thus, the bonding metal is brought into contact with the bottom and sidewall of the depressed portion so that the contact area between the bonding wire 211 and the frame portion increases. In addition, the first contact portion 206 has a surface roughness different from the surface of the first frame 201.

If wire bonding is carried out directly on the surface of the first frame 201 without forming the first contact portion 206, there will be problems in that the contact portion between the bonding wire and the first frame has high resistance due to the small contact area or low surface roughness of the first frame 201 and in that the bonding wire is detached. In order to solve these problems, in the present invention, the contact portion is formed to increase the contact bonding area and achieve low resistance to thereby prevent the bonding wires 211 and 212 from being detached during the operation of the light-emitting device.

The same description applies to the second contact portion that is formed on the second frame. Thus, a bonding metal is filled in the depressed portion defining the second contact portion, and the contact area between the bonding wire 212 and the second frame increases.

The frame of the light-emitting device shown in FIGS. 2 to 7 is integrally formed of a metal. In other words, the bottom and sidewall of the light-emitting device are formed without welding or bonding means using adhesive. Thus, a high heat dissipation effect can be obtained. In addition, because the metal frame constitutes the bottom and sidewall of the package, a high light reflection effect can be obtained. Particularly, when light emitted from the light-emitting portion has a UV wavelength, it will reduce the light reflection properties of a molded portion made of a polymer material according to the prior art and will discolor the polymer material or deteriorate the properties of the polymer material. Unlike this, when the frame is formed of a metal, discoloration or deterioration in the light reflection properties of the frame can be prevented, and high light reflectivity and reliability can be ensured. Particularly, when the frame is formed of aluminum, the effect of reflecting light in the UV wavelength range will significantly increase.

The buffer portion which is provided to seal the window portion is required to have a specific elongation and hardness. In this case, damage caused by the difference in thermal expansion coefficient can be minimized.

In addition, the contact portion is provided on the surface of each of the frames. The contact portion is required to have a surface roughness different from the surface of the frame. Provision of the contact portion can increase the contact area between the bonding metal and the frame and reduce the contact resistance therebetween.

FIG. 8 is a cross-sectional view showing a portion of a light-emitting device according to still another embodiment.

Referring to FIG. 8, the light-emitting portion of the light-emitting device comprises a light-emitting device 241 mounted on the surface.

In addition, the materials, structures and shapes of the frame portion, the electrode portion, the buffer portion and the window portion are as described for FIGS. 2 to 7. Thus, with respect to these elements, reference is made to the description of FIGS. 2 to 7.

In FIG. 8, the light-emitting portion has a light-emitting device 241 and a submount substrate 243. The light-emitting device 241 is mounted on the submount substrate 243. The light-emitting device 241 is preferably of a flip-chip type.

The submount substrate 243 includes Si, AlN or BN. In addition, two metal electrodes 245 and 247 are formed on the submount substrate 243, and each of the electrodes 245 and 247 is electrically connected to the n-type and p-type electrodes of the light-emitting device 241. The electrodes 245 and 247 may be formed of AlNi/Au. In particular, a portion of each of the electrodes, on which the flip-chip type light-emitting device 241 is mounted, may be plated with Au, and the remaining portion may be provided such that Al is exposed. In this case, the light reflectivity and optical output of the flip-chip type light-emitting device 241 provided on the submount substrate 243 are improved. In addition, the two electrodes 245 and 247 on the submount substrate 243 are electrically connected through the bonding wires 211 and 212 to the contact portions of the frames, respectively.

However, a plurality of light-emitting devices may be mounted on the submount substrate 243.

FIGS. 9a to 9c are top views and equivalent circuit diagrams, which show various examples of the light-emitting portion shown in FIG. 8.

Referring to FIG. 9a, four light-emitting devices DA1, DA2, DA3 and DA4 are provided on the submount substrate 243. The p-type electrode of each of the light-emitting devices is electrically connected to the first electrode DLA1, and the n-type electrode is electrically connected to the second electrode DLA2. Thus, between the first electrode DLA1 and the second electrode DLA2, there are formed four light-emitting devices DA1, DA2, DA3 and DA4, which are connected in parallel with each other.

Referring to FIG. 9b, four light-emitting devices DB1, DB2, DB3 and DB4 are provided on the submount substrate 243, and three metal electrodes DLB1, DLB2 and DLB3 are also formed on the submount substrate 243. For example, the p-type electrode of the first light-emitting device DB1 and the p-type electrode of the second light-emitting device DB2 are electrically connected to the first electrode DLB1, and the n-type electrode of the first light-emitting device DB1 and the n-type electrode of the second light-emitting device DB2 are electrically connected to the second electrode DLB2. Further, the p-type electrode of the third light-emitting device DB3 and the p-type electrode of the fourth light-emitting device DB4 are electrically connected to the second electrode DLB2. In addition, the n-type electrode of the third light-emitting device DB3 and the n-type electrode of the fourth light-emitting device DB4 are electrically connected to the third electrode DLB3. Wire bonding for electrical connection with the flames is carried out on the first electrode DLB1 and the third electrode DLB3. This suggests that the four light-emitting devices DB1, DB2, DB3 and DB4 connected to each other in parallel and in series appear in the equivalent circuit diagram.

Referring to FIG. 9c, four light-emitting devices DC1, DC2, DC3 and DC4 are provided on the submount substrate 243, and five electrodes DLC1, DLC2, DLC3, DLC4 and DLC5 are also formed on the submount substrate 243. The first electrode DLC1 is connected to the p-type electrode of the first light-emitting device DC1. Further, the n-type electrode of the first light-emitting device DC1 is electrically connected to the second electrode DLC2. The second electrode DLC2 is connected to the p-type electrode of the second light-emitting device DC2, and the n-type electrode of the second light-emitting device DC2 is connected to the third electrode DLC3. In addition, the third electrode DLC3 is connected to the p-type electrode of the third light-emitting device DC3, and the n-type electrode of the third light-emitting device DC3 is connected to the fourth electrode DLC4. The fourth electrode DLC4 is connected to the p-type electrode of the fourth light-emitting device DC4, and the n-type electrode of the fourth light-emitting device DC4 is connected to the fifth electrode DLC5. This suggests that the four light-emitting devices DC1, DC2, DC3 and DC4 are connected in series to each other. In addition, wire bonding with the flames is carried out through the first electrode DLC1 and the fifth electrode DLC5.

The number of the light-emitting devices mounted on the submount substrate and the electrical connection between the light-emitting devices in FIGS. 9a to 9c may vary depending on an embodiment. Furthermore, the shapes of the electrodes, which may serve as metal wiring interconnects, as well as the shapes of the light-emitting device electrodes, may vary depending on an embodiment.

FIGS. 10 to 12 are cross-sectional views illustrating a method for manufacturing the light-emitting device of FIG. 2 according to one embodiment of the present invention.

Referring to FIG. 10, a first metal layer 300, a second metal layer 310 and an insulating layer 320 are provided. The first metal layer 300 and the second metal layer 310 are bonded to each other by the insulating layer 320. Thus, the insulating layer 320 is preferably made of an adhesive polymer. Further, the first metal layer 300 and the second metal layer 310 are preferably made of the same material. The first metal layer 300, the second metal layer 310 and the insulating layer are aligned in a first direction.

In FIG. 10, each of the first metal layer 300 and the second metal layer 310 may be provided using a metal rod having a predetermined length. For example, the structure shown in FIG. 10 can be formed by preparing two metal layers having a length in a second direction perpendicular to a first direction, bonding the two metal layers to each other with an insulating layer interposed therebetween, and cutting the bonded layers in the first direction.

Referring to FIG. 11, the structure of FIG. 10 is subjected to a selective removal process to partially remove the first metal layer 300, the second metal layer 310 and the insulating layer 320. For example, the structure of FIG. 10 may be subjected to a drilling or removal process in the second direction to form a structure having a depressed central portion.

According to the process shown in FIG. 11, the first metal layer 300 is formed into a first frame 101, the second metal layer 310 is formed into a second frame 103, and the insulating layer 320 is formed into an insulating separation layer 105. Thus, a frame portion 100 consisting of the first frame 101, the second frame 103 and the insulating separation layer 105 is formed. In addition, the bottom and sidewall of the light-emitting device, which consist of the frames, can be formed by a drilling process without using a separate bonding process.

After the frame portion 100 has been formed, a through-hole 109 is formed through the sidewall of the first frame 101 or the second frame 103, and a separate drilling operation is carried out to form a first contact portion 106 on the surface of the first frame 101 and a second contact portion 108 on the surface of the second frame 103. Herein, formation of the contact portions 106 and 108 and formation of the through-hole 109 may be carried out in the reverse order.

Referring to FIG. 12, a light-emitting portion 140 is mounted on the first frame 101, and electrical connection between the light emitting portion 140 and the contact portions 106 and 108 is carried out using bonding wires 111 and 112. Before the light-emitting portion 140 is mounted, the surface of the first frame 101 may be treated with plasma. This plasma treatment is preferable when the first frame 101 is made of a metal such as aluminum. In other words, when the first frame 101 is formed of aluminum or an aluminum alloy, the surface thereof is oxidized in air to form a thin layer of $Al_2O_3$. This $Al_2O_3$ thin layer is a non-conductive material that interferes with the dissipation of heat generated in the light-emitting portion 140. For this reason, this thin oxide layer can be removed by plasma treatment. In addition, removal of the oxide can be carried out by various methods such as a wet cleaning process.

After the wire bonding has been carried out, a buffer portion is formed on the upper surface of the frame portion 100, and a window portion is mounted on the buffer portion. The buffer portion is preferably formed of a silicone polymer material, and during curing of the buffer portion, expanded air is discharged to the outside through the through-hole 109.

Through the above-described process, the light-emitting device shown in FIG. 2 can be manufactured. FIGS. 10 to 12 do not show the formation of an electrode portion. The electrode portion may be formed by a method such as vapor deposition or plating after formation of the first metal layer 300, the second metal layer 310 and the insulating layer 320 as shown in FIG. 10. Alternatively, the electrode portion may also be formed after the drilling process shown in FIG. 11.

FIGS. 10, 13 and 14 are cross-sectional views illustrating a method for manufacturing the light-emitting device of FIG. 3 according to one embodiment of the present invention.

The process shown in FIG. 10 is carried out. However, the through-hole 109 in FIGS. 13 and 14 is formed so as to penetrate the bottom portion of the first frame 101 or the second frame 103. Although not shown in the drawings, when the electrode portion is formed in the step of FIG. 10 or when the electrode portion shown in FIG. 2 is provided before formation of the through-hole 109, the through-hole 109 is formed so as to penetrate even the electrode portion.

Elements other than the through-hole and the formation thereof are as described for FIGS. 11 and 12.

In addition, the shape of the frame portion is determined according to the shape of a drill used in the drilling process. This is evident from FIG. 15.

FIGS. 10, 15 and 16 are cross-sectional views illustrating a method for manufacturing the light-emitting device of FIG. 4 according to one embodiment of the present invention.

Referring to FIG. 15, when the structure shown in FIG. 10 is subjected to a drilling process using a stepped drill, frames 201 and 203 having a step portion 210 formed thereon can be formed. Then, a separate drilling process is carried out to form a first contact portion 206 and a second contact portion 208. It is to be understood that the sidewall of each of the frames 201 and 203 may have the through-hole 209.

Referring to FIG. 16, a light-emitting portion 240 is mounted on the first frame 201 and connected with bonding wires 206 and 208. Before the light-emitting portion 240 is mounted, the surface of the first frame 201 may be treated with plasma. This plasma treatment is preferable when the first frame 201 is made of a metal such as aluminum. In other words, when the first frame 201 is formed of aluminum or an aluminum alloy, the surface thereof is oxidized in air to form a thin layer of $Al_2O_3$. This thin oxide layer is a non-conducting material that interferes with the dissipation of heat generated in the light-emitting portion 240. For this reason, it is preferable to remove the oxide layer by plasma treatment.

After the wire bonding has been carried out, a buffer portion is formed on the step portion 210 of the frame portion 200, and a window portion is mounted on the buffer portion. The buffer portion is preferably formed of a silicone polymer material, and heat generated curing of the buffer portion is discharged to the outside through the through-hole.

Through the above-described process, the light-emitting device shown in FIG. 4 can be manufactured.

FIGS. 10, 17 and 18 are cross-sectional views illustrating a method for manufacturing the light-emitting device of FIG. 5 according to one embodiment of the present invention.

The process shown in FIG. 10 is carried out. However, the through-hole 209 in FIGS. 17 and 18 is formed so as to penetrate the bottom portion of the first frame 201 or the second frame 203. Although not shown in the drawings, when the electrode portion is formed in the step of FIG. 10 or when the electrode portion shown in FIG. 5 is provided before formation of the through-hole 209, the through-hole 209 is formed so as to penetrate even the electrode portion.

Elements other than the through-hole and the formation thereof are as described for FIGS. 15 and 16.

FIGS. 10 to 18 do not show the structure of the electrode portion shown in each of FIGS. 2 to 5. The electrode portion may be formed by a method such as electroplating after formation of the structure shown in FIG. 10. Alternatively, it may also be formed after the drilling process shown in each of FIGS. 11, 13, 15 and 17.

In the light-emitting devices shown in FIGS. 2 to 5, internal expanded air generated during curing of the buffer portion can be discharged to the outside through the through-hole. In addition, the through-hole shown in each of FIGS. 3 and 5 may be sealed during mounting on a printed circuit board after the window portion has been fixed by curing of the buffer portion. In other words, when the manufactured light-emitting device is mounted on a printed circuit board using a conductive adhesive or the like, the through-hole penetrating the bottom portion of the frame portion can be sealed in the mounting process using the conductive adhesive.

According to the present invention as described above, the bottom and sidewall of the light-emitting device are integrally formed of a metal material. Thus, heat generated in the light-emitting portion can be easily dissipated to the outside, and the reflection of light in the package is easily performed even when the introduction of a special method such as surface treatment is excluded. Thus, the efficiency of light extraction from the package is improved.

In addition, due to the contact portion provided in a depressed form on the surface of the frame portion, the area of contact of the bonding wire with the frame portion is increased. This reduces the contact resistance between the bonding wire and the frame portion and prevents the bonding wire from being detached from the frame portion.

FIG. 19 is a perspective view of a substrate for an optical device according to another embodiment of the present invention, and FIG. 20 is a cross-sectional view of the substrate shown in FIG. 20.

As shown in FIGS. 19 and 20, a substrate for an optical device according to another embodiment of the present invention comprises: a metal frame portion 400 having a predetermined thickness and having a depressed portion 440 formed in the upper surface thereof; a chip-mounting region formed in a predetermined region of the bottom portion of the depression 440; and a first bonding aid layer 450 formed on at least a portion of the chip-mounting region.

Herein, the frame portion 400 comprises a first frame 410, an insulating separation layer 430 and a second frame 420, wherein the insulating separation layer 430 is interposed between the first frame 410 and the second frame 420, and thus the first frame 410 and the second frame 420 are opposite to each other with respect to the insulating separation layer 430 and spaced apart from each other.

The first frame 410 and the second frame 420 are formed of a metal material, preferably aluminum (Al) or an aluminum alloy, and the insulating separation layer 430 having a predetermined width is bonded between the first frame 410 and the second frame 420.

The insulating separation layer 430 may be made of any material that maintains adhesion to the first frame 410 and the second frame 420 and has insulating properties. The first frame 410 and the second frame 420 are electrically insulated from each other by the insulating separation layer 430.

Also, the insulating separation layer 430 is preferably disposed at a predetermined distance from the chip-mounting region. As the chip-mounting region is formed in the central portion of the frame portion 400, the insulating separation layer 430 is disposed in the central portion of the frame portion 400 in such a manner that it is positioned at any one side of the chip-mounting portion to insulate the first frame 410 and the second frame 420.

In the embodiment shown in FIGS. 19 and 20, the insulating separation layer 430 is positioned at the left side of the chip-mounting region, and thus the width of the first frame 410 is larger than that of the second frame 420.

Meanwhile, a depressed portion 440 is formed in upper surface of the frame portion 400. The depressed portion 440 serves to ensure a region for receiving a light-emitting device 470 (see FIG. 21), and the inner circumferential surface of the depressed portion 440 may be formed perpendicular to the bottom thereof. As shown in FIGS. 19 and 20, the inner circumferential surface of the depressed portion 440 is preferably formed to slope at an angle effective for light reflection.

On the bottom of the depressed portion 440, that is, the upper surface of the first frame 410 having the depressed portion 440 formed therein, the chip-mounting region is formed. On at least a portion of the chip-mounting region, a first bonding aid layer 450 is formed.

Herein, the first bonding aid layer 450 serves to increase the wettability between a Sn-based solder and the frame portion 400 during soldering of the light-emitting device 470 so as to firmly attach the light-emitting device 470 to the frame portion 400, to thereby prevent the light-emitting device 470 from being detached from the frame portion 400 and increase the efficiency of heat dissipation from the package.

The Sn-based solder may be made of Sn or a Sn alloy, for example, AuSn, SnAgCu, SnBl, SnPb, SnPbAg, SnSb, SnCu, SnAg or the like. The Sn alloys may have various composition ratios.

The dimensions including the length and width of a region on which the first bonding aid layer 450 is formed can be suitably selected depending on the dimensions of the light-emitting device 470 mounted.

The first bonding aid layer 450 can be formed by applying a molten metal material or by a method such as vapor deposition or plating. For example, it may be formed of Ni/Ag or Ni/Au or Cu.

At the sloped surface of the depressed portion 440, a step portion 460 stepped downward from the upper surface of the frame portion 400 is formed along the upper circumference. The step portion 460 serves to support both ends of a window portion 490 (see FIG. 21) during bonding of the window portion as described below.

In addition, a first electrode 481 is formed on the lower surface of the first frame 410, and a second frame 482 is formed on the lower surface of the second frame 420. Each of the electrodes may be formed of Ni/Ag or Ni/Au or Cu.

FIG. 21 shows the state of use of a light-emitting device according to another embodiment of the present invention, which comprises the above-described optical device substrate.

As shown in FIG. 21, the light-emitting device according to the preferred embodiment of the present invention comprises: a frame portion 400 comprising a chip-mounting region thereon; a light-emitting device 470 mounted on at least a portion of the chip-mounting region with a bonding layer 455 interposed therebetween; and a first bonding aid layer 450 formed between the bonding layer 455 and the frame portion 400.

The light-emitting device 470 may be in the form of a diced individual chip, a plurality of chips connected by metal wiring, or a surface-mounted chip. It is mounted on the chip-mounting region of the frame portion 400 by the bonding layer 455 consisting of a Sn-based solder.

The first bonding aid layer 450 is made of a material having better wettability to the frame portion 400 than that of the bonding layer 455. For example, it is made of Ni/Ag or Ni/Au or Cu. The first bonding aid layer 450 is interposed between the bonding layer 455 and the frame portion 400 to increase the wettability between the bonding layer 455 and the frame portion 400, whereby the light-emitting device 470 can be mounted on the chip mounting region of the frame portion 400 by a method such as soldering or reflow soldering such that it can be firmly attached to the chip-mounting region.

Further, the light-emitting device 470 is electrically connected to the first frame 410 and the second frame 420 by a bonding wire 471.

In addition, a window portion 490 is mounted on the step portion 460. Herein, a buffer portion 491 made of a soft material having a specific adhesive strength and thermal expansion coefficient is preferably interposed between the window portion 490 and the step portion 460. The buffer portion 491 may be made of an organic or inorganic adhesive polymer such as urethane, epoxy, acrylic or silicone resin.

FIG. 22 shows a substrate for an optical device according to another embodiment of the present invention, wherein a second bonding aid layer is formed on a step portion. The configuration of the embodiment shown in FIG. 22 is substantially similar to the embodiment shown in FIGS. 19 to 21.

However, the embodiment of FIG. 22 has the following differences from the embodiment of FIGS. 19 to 21: while the window portion 490 and the frame portion 400 are soldered with a Sn-based solder as described above in order to prevent reliability from decreasing due to water penetration, the second bonding aid layer 465 is formed on the bottom of the step portion 460 so that the window portion 490 and the frame portion 400 are strongly bonded to each other by the second bonding aid layer 465, and the depressed portion 440 is completely sealed.

Thus, the same elements in FIG. 22 as those in the embodiment of FIGS. 19 to 21 are denoted by the same reference numerals, and the repeated description thereof is omitted.

The second bonding aid layer 465 may be formed by applying a molten metal material or by a method such as vapor deposition or plating and may be made of the same material as that of the first bonding aid layer 450, for example, Ni/Ag or Ni/Au or Cu.

In addition, the second bonding aid layer 465 may be formed at the same time as, before or after formation of the first bonding aid layer 450.

FIG. 23 is a process diagram showing the sequential steps of a method for manufacturing the light-emitting device of FIG. 21 according to another embodiment of the present invention.

Hereinafter, a method for manufacturing a light-emitting device according to a preferred embodiment of the present invention will be described with reference to FIG. 23.

Step of Preparing Frame:

A frame 500 having a predetermined thickness is prepared.

Herein, the frame 500 can be prepared by bonding a first frame 510 and a second frame 520, which are made of a metal material, to the left and right sides of an insulating separation layer 530 having a predetermined width, respectively.

The first frame 510 and the second frame 520 are preferably made of aluminum or an aluminum alloy.

Preferably, the insulating separation layer 530 is disposed at one side of to the central portion (chip-mounting region) of the frame 500 such that it does not cross a first bonding aid layer 450 as described below and the width of the first frame 510 is larger than that of the second frame 520.

Herein, a first electrode 481 and a second electrode 482, which are made of, for example, Ni/Ag or Ni/Au or Cu, may be provided on the lower surfaces of the first frame 510 and the second frame 520, respectively. Preferably, the first electrode 481 and the second electrode 482 are formed during the preparation of the frame 500.

Step of Forming Step Portion and Depressed Portion:

The central portion of the upper surface of the frame 500 is machined with a drill or the like to form a depressed portion 440 having a predetermined diameter and depth. Herein, the inner circumferential surface of the depressed portion 440 is preferably formed to slope at an angle effective for light deflection.

In addition, the upper circumference of the slopped surface of the depressed portion 440 is machined with a drill or the like to form a step portion 460 having a predetermined width, which is stepped downward from the upper surface of the frame 500.

The order in which the depressed portion 440 and the step portion 460 are formed can be suitably selected as required. In other words, as described above, the depressed portion 440 is formed, after which the step portion 460 is formed along the upper circumference of the depressed portion 440. Alternatively, after the step portion 460 has been formed, the depressed portion 440 is formed along the inner circumference of the step portion 460.

In FIG. 23, reference numeral 500 indicates the frame before formation of the step portion 460 and the depressed portion 440, and reference numeral 400 indicates the frame portion on which the step portion 460 and the depressed portion 440 had been formed by machining. In addition, reference numerals 510 and 410, 520 and 420, and 530 and 430 are applied in the same manner.

Step of Forming Coating Layer:

A coating layer 540 is formed on the frame portion 400.

Herein, the coating layer 540 is formed to a predetermined thickness on the first frame 410 and the second frame 420, which comprise the bottom surface and sloped surface of the depressed portion 440 and the bottom and sidewall of the step portion 460. For example, the coating layer 540 can be formed by the melting and application, deposition or plating of a metal material having excellent conductivity and metal bonding strength, such as Ni/Ag or Ni/Au or Cu.

Step of Forming Bonding Aid Layer:

A portion of the coating layer 540, excluding a region in which a bonding aid layer is to be formed, is removed to form the bonding aid layer on a predetermined region of the frame portion 400. Herein, the removal of the coating layer 540 can be performed by machining the upper surface of the frame portion 400 with a drill or the like.

According to a preferred embodiment of the present invention, as shown in FIG. 23, the first bonding aid layer 450 can be formed only on a predetermined region of the depressed portion 440, and in this case, the coating layer 540 is partially removed to leave only a portion corresponding to a predetermined region of the bottom portion of the depressed portion 440.

According to another embodiment of the present invention, as shown in FIG. 22, the bonding aid layer may be formed not only on the bottom surface of the depressed portion 440, but also on the bottom surface of the step portion 460. In other words, the first bonding aid layer 450 may be formed on the bottom surface of the depressed portion 440, and the second bonding aid layer 465 may be formed on the bottom surface of the step portion 460. In this case, the coating layer 540 is partially removed to leave a predetermined region of the bottom surface of the depressed portion 440 and the bottom surface of the step portion 460.

Step of Mounting Light-Emitting Device:

The light-emitting device 470 is mounted on the first bonding aid layer 450 by a method such as soldering or reflow soldering. In this case, the light-emitting device 470 and the frame portion 400 are firmly bonded to each other by the bonding layer 455, which consists of a Sn-based solder, and the first bonding aid layer 450.

In the prior art, an Ag paste containing an organic material was used to attach the light-emitting device 470 to the frame portion 400, and thus when the organic material contained in the Ag paste was deteriorated by light (particularly UV light) emitted from the light-emitting device 470, delamination of the light-emitting device 470 or the Ag paste occurred.

However, according to the present invention, this delamination phenomenon can be prevented, because the light-emitting device 470 is firmly mounted on the frame portion 400 by the bonding layer 455, which is made of a Sn-based solder, and the first bonding aid layer 450.

In addition, the efficiency of heat dissipation can be increased, because heat generated in the light-emitting device 470 is rapidly transferred to the frame portion 400 through the bonding layer 455 and the first bonding aid layer 450.

FIG. 24 is a process diagram showing the sequential steps of another method for manufacturing the light-emitting device of FIG. 21.

In the above embodiment shown in FIG. 23, the coating layer 540 is formed on the entire upper surface of the frame portion 400, and then a portion of the coating layer 540, excluding a portion to be used as the bonding aid layer, is removed, thereby forming the bonding aid layer.

However, according to another embodiment of the present invention, the step of forming the coating layer 540 on the entire upper surface of the frame portion 400 is not carried out, a region on which the bonding aid layer is to be formed is selected and the bonding aid layer is formed only on the selected region.

This embodiment of the present invention is shown in FIG. 24, and the steps of preparing the frame, forming the step portion and the depressed portion and mounting the light-emitting device are performed in the same manner as the embodiment shown in FIG. 23. The repeated description of the same steps as those in the embodiment shown in FIG. 23 is omitted.

According to another embodiment of the present invention, the steps of preparing the frame and forming the step portion and the depressed portion are sequentially carried out, and then the step of forming the bonding aid layer is carried out without carrying out the step of forming the coating layer, unlike the embodiment shown in FIG. 23.

In the step of forming the bonding aid layer, the first bonding aid layer 450 is formed on a predetermined region of the bottom surface of the depressed portion 440, for example, by the application, deposition or plating of a metal material.

It is to be understood that a second bonding aid layer 465 may be formed on the step portion 460 in the same manner as the first bonding aid layer and that the first bonding aid layer 450 and the second bonding aid layer 465 may be formed in any order.

After the step of forming the bonding aid layer, the step of mounting the light-emitting device is carried out in the same manner as the embodiment shown in FIG. 23.

FIG. 25 is a top view of a light-emitting device according to another embodiment of the present invention, and FIG. 26 is a cross-sectional view taken along line A-A of FIG. 25. Also, FIG. 27 is a conceptual view illustrating a method for manufacturing a light-emitting device according to another embodiment of the present invention, and FIG. 28 is a cross-sectional view taken along line B-B of FIG. 25, which illustrates an air passage groove in a light-emitting device according to another embodiment of the present invention.

Referring to FIGS. 25 to 28, the light-emitting device comprises a light-emitting chip 660.

Illustratively, referring to FIGS. 26 and 27, the light-emitting chip 660 may be mounted in a hole cup 640 and may be electrically connected to each of a first frame 610 and a second frame 620. This electrical connection can be performed by a bonding wire 665 as shown in the drawings or can be performed by direct contact.

One light-emitting chip 660 may be mounted in the hole cup 640 so as to serve as a point light source, but is not limited thereto. Depending on the scale of the light-emitting device, the light intensity to be ensured, and the like, a plurality of light-emitting chips 660 may also be disposed in the hole cup 640. In other words, a plurality of light-emitting chips 660 may be provided. This will be described in further detail with reference to FIGS. 32 and 33.

Also, the light-emitting chip 660 may be a flip chip. Illustratively, referring to FIG. 26, the light-emitting chip 660 may comprise an epitaxial layer 662 and a substrate 661 provided on the epitaxial layer 662. Herein, the substrate 661 may be a sapphire substrate. In addition, the light-emitting chip 660 may comprise a bump 663 under the epitaxial layer 662. In other words, it can be understood that the light-emitting chip 660 comprises the bump 663.

Technical details about the above-described flip chip are apparent to those skilled to those skilled in the art, and thus the detailed description thereof is omitted.

However, referring to FIG. 26, when the light-emitting chip 660 is a flip chip, the light-emitting chip 660 may comprise an insulating layer surrounding around the epitaxial layer 662 and the bump 663. This insulating layer 664 can function to reflect light emitted from the epitaxial layer 662.

In other words, because the epitaxial layer 662 and the bump 663 are surrounded by the insulating layer 664, light emitted laterally or backward is reflected by the insulating layer 664 and irradiated upward, and thus the efficiency of light extraction can be significantly improved. The light reflected by the insulating layer 664 as described above is irradiated upward through a lens 670 as described below, and thus a higher light extraction effect can be ensured.

In addition, the light-emitting device comprises a frame portion 600.

A light-emitting chip 660 is mounted on the frame portion 600.

Referring to FIGS. 25 to 28, the hole cup 640 for mounting the light-emitting chip 660 may be formed in the upper surface of the frame portion 600. Illustratively, as shown in FIGS. 25 to 28, the hole cup 640 may be formed such that it is stepped downward from the upper surface of the frame portion 600. In addition, on the inner circumferential surface of the hole cup 640, a reflective surface for no ensuring light intensity can be formed.

Referring to FIGS. 25 to 28, 32 and 33, a submount 650 for mounting the light-emitting chip 660 may be provided on the upper portion of the frame portion 600. This submount 650 may be made of a material selected from among Si, AlN, and BN.

Illustratively, the conductive pattern of the submount 650 can be formed by plating Au on AlN. In addition, the submount 650 is formed by forming Al/Ni/Au layers on AlN, plating Au only on a portion for mounting the light-emitting chip 660, exposing aluminum (Al) of the remaining portion. Thus, the reflectivity of an area of the submount 650, which excludes the submount area used for mounting of the light-emitting chip 660, can be significantly increased so that the optical output can further be increased.

Referring to FIGS. 25 to 28, the light-emitting device may comprise a window 680 covering the hole cup 640. In other words, the window portion 680 may be provided to protect the lens 670, the light-emitting chip 660, the bonding wire 665 and the like.

If only the window portion 680 spaced apart from the light-emitting chip 660 is provided in the light-emitting device, the light intensity can be reduced, like the prior art package. However, in the light-emitting device according to the present invention, the lens 670 described below is disposed on the light-emitting chip 660 by dotting in order to control the directional angle of light emitted from the light-emitting chip 660 while minimizing the total reflection of the light. Thus, the lend 670 has advantages in that it can improve the efficiency of light extraction while stably protecting the elements included in the hole cup, including the light-emitting chip 660 and the bonding wire 665.

In addition, the shape of the window portion 680 can be selected as required from various shapes, including a window type (see the figures) and a convex lens such as a hemispherical lens. In other words, the light divergence angle and the light intensity can be controlled depending on the shape of the window portion 680.

In addition, the window portion 680 may be made of a material having a predetermined light transmittance, for example, a glass material. Particularly, when the light-emitting chip 660 emits UV-C light, the window portion 680 is preferably made of a material such as quartz, which transmits UV-C light.

Although not shown in the drawings, the window portion 680 can be attached to the frame portion 600 by an adhesive.

However, when the window portion 680 is made of quartz as described above and the frame portion 600 is made of aluminum, the coefficient of thermal expansion (CTE) of quartz is $0.59 \times 10\text{-}6/T$, whereas the coefficient of thermal expansion of aluminum is $23 \times 10\text{-}61°$ C., which significantly differs from that of quartz. In this case, if the adhesive that is used to attach the window portion 680 to the frame portion 600 has a Shore D hardness of 60 or higher or an elongation of 70% or lower, the window portion 680 made of quartz can be damaged due to the significant difference in the coefficient of thermal expansion between aluminum and quartz. For this reason, the adhesive is preferably selected in view of hardness and elongation.

In addition, the frame portion 600 may comprise a step portion 601 which is formed to be stepped to engage the circumference of the window portion 680. Illustratively, referring to FIGS. 25 to 28, the step portion 601 is formed such that the window portion 680 can cover and protect the light-emitting chip 660, and thus the step portion 601 can be formed to be stepped at the upper portion of the hole cup 640.

When the step portion 601 is formed as described above, the window portion 680 attached to the frame 600 can be prevented from moving in the horizontal direction (perpendicular to the vertical direction), and thus the light-emitting device can be more stably realized.

However, when the window portion 680 was placed on the step portion 601, the phenomenon frequently occurred that gas contained in the cavity such as the hole cup 640 receiving the light-emitting chip 660 was compressed without being discharged to the outside or the window portion 680 came off. If the package was maintained on a state in which gas in the cavity was compressed, there was a problem in that upward gas pressure continuously acted on the window portion 680 to reduce the stability of the package.

To solve this problem, an air passage groove 603 may be formed at a predetermined location of the bottom surface of the step portion 601 as shown in FIGS. 25 and 28. In addition, as shown in FIGS. 25 and 28, the air passage groove 603 may be formed to extend outward from the circumference of the step portion 601. In other words, as shown in FIG. 28, the air passage groove 603 depressed from the bottom surface of the step portion 601 is provided, gas in the cavity can be easily discharged to the outside without being compressed.

After the window portion 680 has been mounted to engage the step portion 601 while air in the cavity has been suitably discharged through the air passage groove 603, a suitable amount of a sealing material is generally injected into the outwardly protruding portion of the air passage groove 603 as shown in FIG. 25 in order to prevent foreign matter (for example, water which can be introduced during dicing) from entering the cavity. However, in order to prevent the sealing material from overflowing into the cavity, the air passage groove 603 comprises a slope portion inclined downward toward the outside as shown in FIG. 28.

In addition, if an adhesive is applied or sprayed onto the step portion 601 in order to attach the window portion 680, the adhesive can flow into the cavity such as the hole cup 640 when the air passage groove 603 is formed to slope downward toward the cavity. For this reason, the air passage groove 603 comprises the slope portion inclined downward toward the outside as described above.

FIG. 29 is a schematic cross-sectional view illustrating an air passage hole in a light-emitting device according to one embodiment of the present invention.

Referring to FIG. 29, the light-emitting device may comprise an air passage hole 605, which extends from the hole cup 640 to the lower surface of the frame portion 600, in place of the above-described air passage groove 603, in order to prevent gas pressure from acing on the window portion 680 or prevent the window portion from coming off. Illustratively, as shown in FIG. 29, the air passage hole 605 is formed through the bottom surface of the hole cup 640 and the lower surface of the frame portion 600.

When the air passage hole 605 extending to the lower surface of the frame portion 600, the window portion 680 can be prevented from coming off in the process of attaching the window portion 680. In particular, this air passage hole 605 is automatically blocked during mounting on a PCB in a subsequent SMD process, and thus the operation of introducing the sealing material into the air passage groove 603 as described above can be omitted. Thus, the configuration of the package can be more simplified, and increased productivity can be ensured.

Referring to FIGS. 25 to 28, the frame portion 600 may comprise: a first frame 610; a second frame 620 disposed with a gap from the first frame 610; and an insulating separation layer 630 provided in the gap.

The first frame 610 and the second frame 620 may be made of a conductive material.

In addition, the frame portion 600 may be made of a metal material, for example, aluminum. When the frame portion 600 is made of aluminum, a reflective surface having high reflectivity can be formed on the inner circumferential surface of the hole cup 640, formed in the frame 600, without having to form an additional reflective coating layer. Particularly, aluminum has high reflectivity to UV-C light. In addition, when the frame portion 600 is made of a metal material such as aluminum, a high heat dissipation effect can be obtained. However, the material for the frame portion 600 is not limited to a metal material such as aluminum, and the frame portion 600 may also be made of a ceramic material.

Further, each of the first frame 610 and the second frame 620 may be made of aluminum. When the first frame 610 and the second frame 620 are made of conductive aluminum as described above and the insulating separation layer 630 is interposed therebetween, electrical connection of the light-emitting chip 660 to each of the first frame 610 and the second frame 620 can be performed in an easier and free manner, and thus the configuration of the package can be more simplified.

In addition, as described above, the hole cup 640 may be formed in the upper surface of the frame portion 600, and in this case, the insulating separation layer 630 can be provided so as to cross the hole cup 640.

More specifically, the hole cup 640 can be defined by the first frame 610, the insulating layer 630 and the second frame 620. In other words, the hole cup 640 can be completely defined by a combination of the first frame 610, the insulating separation layer 630 and the second frame 620.

Referring to FIG. 26, the left portion of the hole cup 640 is defined by the stepped portion of the first frame 610, and the right portion of the hole cup 640 is defined by the stepped portion of the second frame 620, and the insulating separation layer 630 is provided in the gap between such stepped portions, thereby defining the shape of the hole cup 640.

In addition, a submount 650 for mounting the light-emitting chip 660 can be provided on a portion of the hole cup 640, defined by the first frame 610 or the second frame 620. Illustratively, referring to FIGS. 25 to 28, the submount 650 is disposed on the second frame 620 and can be electrically connected with the first frame 610 by the bonding wire 665.

FIG. 32 is a schematic top view showing the structure of a submount on which a light-light emitting device chip is disposed, and FIG. 33 is a schematic top view showing the structure of submounts on which a plurality of light-emitting chips are disposed.

Illustratively, referring to FIG. 32, a light-emitting device chip 660 can be disposed on a submount 650, in which the submount 650 may comprise two electrode connecting members. One of the two electrode connecting member is connected with the P-type electrode of the light-emitting chip 660, and the other is connected with the N-type electrode of the light-emitting chip. Thus, the two electrode connecting members are preferably disposed at a distance from each other.

Referring to FIG. 33, a plurality of light-emitting chips 660 can be provided as described above. In addition, a plurality of submounts 650 on which the plurality of light-emitting chips are respectively mounted can be provided on the frame portion 600.

Referring to FIG. 33(*a*), the submount 650 may comprise a plurality of electrode connecting members 651 which are disposed at a distance from each other such that the plurality of light-emitting chips 660 are connected in parallel to each other.

Referring to FIGS. 33(*b*) and 33(*c*), the submount 650 may comprise a plurality of electrode connecting members 651 which are disposed at a distance from each other such that the plurality of light-emitting chips 660 are connected in series and in parallel to each other.

Illustratively, as shown in FIGS. 33(*b*) and 33(*c*), four light-emitting chips can be connected in series and in parallel to each other by three electrode connecting members 651.

More specifically, two light-emitting chips on the left side of FIG. 33(*b*) are connected in parallel to each other as shown in FIG. 33(*a*), and two light-emitting chips on the right side are also connected in parallel to each other. The group of light-emitting chips on the right and the group of light-emitting chips on the right side are connected in series to each other as shown in FIG. 33(*d*).

In addition, two light-emitting chips on the upper portion of FIG. 33(*c*) are connected in parallel to each other as shown in FIG. 33(*a*), and two light-emitting chips on the lower portion are also connected in parallel to each other. The group of light-emitting chips on the upper portion and the group of light-emitting chips on the lower portion are connected in series to each other as shown in FIG. 33(*d*).

Referring to FIG. 33(*d*), the submount 650 may comprise a plurality of electrode connecting members 651 which are disposed at a distance from each other such that the plurality of light-emitting chips 660 are connected in series to each other.

In addition, the light-emitting device comprises a lens 670.

Referring to FIG. 27, the lens 670 is formed on the light-emitting chip 660 by dotting. The lens 670 is disposed in order to control the directional angle of light emitted from the light-emitting chip 660 to thereby increase the efficiency of light extraction and the quality of light.

Illustratively, as shown in FIG. 27(*b*), the lens 670 is formed by dotting a material such as silicone on the light-emitting chip 660 by means of a dispenser 700.

Because the lens 670 is formed by dotting as described above, the formed lens has a smooth convex curved shape that minimizes the quantity of light totally reflected by the interface. This lens can be easily formed without having to carry out an additional molding process and can significantly increase the efficiency of light extraction. In addition, because the lens 670 covers the upper surface of the light-emitting chip 660, it can protect the light-emitting chip 660. Further, because the lens is formed by dotting, increased productivity can be obtained.

In addition, the height (i.e., curvature) of the lens 670 can be controlled by controlling the amount of the lens material dotted, and thus the quality of light and the efficiency of light extraction can be easily controlled in view of the wavelength of light emission.

Referring to FIG. 26, when the light-emitting chip 660 is a flip chip as described above and the insulating layer 664 is formed to surround around the epitaxial layer 662 and the bump 663 so as to function to reflect light, light reflected upward by the insulating layer 664 passes through the lens 670 having a smooth curved shape, and thus the efficiency of light extraction can be significantly increased. In other words, the combination of the insulting layer 664 with the lens 670 can significantly increase the intensity of light and the efficiency of light extraction.

FIG. 30 is a graph showing an increase (%) in light intensity as a function of the ratio of the lens height to the width of the light-emitting chip. As used herein, the expression "height of the lens 670" refers to the height from the upper surface of the light-emitting chip 660 to the top of the lens 670 formed by dotting.

As shown in FIG. 30, if the lens 670 is formed to a height lower than $1/30$ of the width of the light-emitting chip 660, it will not substantially contribute to an increase in the intensity of light, and if the lens height is higher than $20/30$ of the width of the light-emitting chip 660, saturated light intensity will be reached so that light intensity will no longer increase. In addition, if the lens height is higher than $20/30$ of the width of the light-emitting chip 660, the possibility for the dotted material to flow down from the light-emitting chip 660 without forming the lens will significantly increase depending on the thixotropy of the dotted material, making stable formation of the lens 670 difficult.

Accordingly, the length 670 is preferably formed to a height corresponding to $1/30$-$20/30$ of the width of the light-emitting chip 660. In this case, light intensity can be increased by about 80%.

As described above, the lens 670 can be formed by dotting of silicone. If a material such as silicone is dotted, the lens 670 can be slightly collapsed by gravity or the like so that the height of the lens formed, even when the material is dotted to a height corresponding to ½ of the width of the light-emitting chip 660 in order to form a hemispherical lens 670. Referring to FIG. 30, light intensity increases with an increase in the ratio of the height of the lens 670 to the width of the light-emitting chip 660. Thus, in order to ensure light intensity, the dotting height is preferably increased as much as possible up to the height at which the rate of an increase in light intensity starts to remain at 80% (height corresponding to $20/30$ of the width of the light-emitting chip 660).

However, if the dotting height of any material is excessively increased, the dotted material can flow down without remaining on the light-emitting chip 660 in some cases. Thus, in order for the lens 670 to be formed on the light-emitting chip 660 to a height approaching $20/30$ of the width of the light-emitting device without flowing down, a material having high thixotropy is preferably dotted.

As used herein, the term "thixotropy" refers to the flow-related property of a material that changes to a flowable sol when shaken and returns to a gel when allowed to stand. In other words, when the internal bonds of the gel are partially completely broken by an external force, the flowability thereof increases, but when the material is allowed to stand, the particles of the material agglomerate again.

However, if a material having a thixotropic index lower than 0.8 is dotted, it will be maintained in the sol state even after dotting, and thus will flow down from the light-limiting device chip 660. On the other hand, if a material having a thixotropic index lower than higher than 7 is dotted, the flowability of the material will rapidly disappear immediately after dotting, making it difficult to form a smooth convex curved shape. Thus, the material such as silicone that is used to form the lens 670 preferably has a thixotropic index of 0.8-7.

FIG. 31 is a graph showing the light transmittance of each of dimethyl type silicone, phenyl type silicone and epoxy as a function of light wavelength.

Herein, the light-emitting chip 660 may be a UV light-emitting chip, for example, a UV light-emitting diode (UV LED) chip.

For reference, the UV (ultraviolet) spectrum can be divided into UV A, B and C. Generally, UV A and B have a wavelength longer than UV C, and various polymers that transmit UV A and B are known. However, polymers that transmit UV C (deep UV) are limited and also have low thermal stability and low long-term reliability.

Thus, in the case of a deep UV LED chip comprising the light-emitting chip 660 that emits UV C light, the lens 670 is preferably formed by dotting a selected optimal material which can transmit a given level or higher of UV C light to increase total light intensity while ensuring thermal stability and long-term reliability.

When the light-emitting chip 660 is a chip that emits UV C light, the lens 670 may be made of dimethyl type silicone.

Referring to FIG. 31, the light transmittance of dimethyl type silicone in the short wavelength range (300 nm or shorter) is higher than that of phenyl type silicone or epoxy. In addition, the results of a thermal aging test for 200 hours indicate that dimethyl type silicone does not discolor at a temperature of 130~200° C., suggesting that the thermal stability and long-term durability thereof can be sufficiently ensured.

This thermal stability and long-term durability can provide the following advantage. For example, a reflow process is required when the light-emitting device is mounted on a printed circuit board (PCB). In this reflow process, the light-emitting device is exposed to a temperature of 260° C. or higher for several tens of seconds. Thus, when the lens 670 is formed by dimethyl type silicone that does not discolor over a long period of time at a temperature of 130~200° C., the dimethyl type silicone can be prevented from discoloring in the reflow process.

As described above, when the dimethyl type silicone that transmits UV C light is dotted on the light-emitting chip 660, the lens 670 having a convex shape can be easily formed without having to carry out an additional molding process. This lens can increase the optical efficiency of the package and does not discolor even by the long-term action of heat, suggesting that the thermal stability and long-term reliability thereof can be ensured.

Referring to FIG. 31, for light other than UV C light, the light transmittance of phenyl type silicone is slightly higher than those of other polymers. Also, dimethyl type silicone has a refractive index of about 1.4, whereas phenyl type silicone has a refractive index slightly higher than dimethyl type silicone. Thus, for light other than UV C light, light transmittance can be further increased when the lens 670 is formed by dotting of phenyl type silicone.

Particularly, when the light-emitting chip 660 is a flip chip having a sapphire substrate having a refractive index of about 1.76 and when the lens 670 is formed of phenyl type silicone, the difference in refractive index between the substrate and the lens 670 is reduced compared to when the lens 670 is formed of dimethyl type silicone, and thus the efficiency of light extraction can be increased.

FIG. 34 is a top view of a light-emitting device according to another embodiment of the present invention, and FIG. 35 is a cross-sectional view taken along line C-C of FIG. 34.

Referring to FIGS. 34 and 35, the light-emitting device comprises a frame portion 800 as a package body, a submount 830, a light-emitting device 840, a window portion 860, an adhesive 850 and a sealing material 870.

The frame portion 800 may comprise an outer wall 811 defining the outer circumference of the frame portion 800, an upper surface 812 surrounded by the outer wall 811, and a cavity 813 surrounded by the upper surface 812. The frame portion 800 may be a ceramic body formed by a simultaneous firing process using a ceramic sheet, but is not limited thereto. The frame portion 800 may also be a plastic body.

In addition, lead frames 820 may be provided on the lead frame 800. For electrical connection to an external power source, the lead terminals 820 extend to the outside of the frame portion 800.

The light-emitting device 840 is mounted in the cavity 813. The light-emitting device 840 is flip-bonded on the submount 830, and the submount 830 can be attached to the package body using an adhesive or the like. The light-emitting device is, for example, a DUV LED that can emit light having a wavelength of 250-365 nm. Meanwhile, bonding wires can electrically connect the submount 830 to the lead terminals 820 formed on the frame portion.

The window portion 860 is bonded to the frame portion 800 by the adhesive 850. The adhesive 850 is located on the upper surface 812 surrounding the cavity 813 so that it bonds the window portion 860 to the frame portion 800. The adhesive 850 may be formed on a portion of the upper portion 812 surrounding the cavity 813 so that a passage can be formed between the window portion 860 and the upper portion 812. However, the present invention is not limited, and the adhesive 850 can be used to seal the cavity 813.

The adhesive 850 may be, for example, acrylic, silicone or urethane or epoxy resin. Among them, epoxy has high light absorption, and the light absorption of silicone is only ¹⁄₁₀ of epoxy, and thus silicone is preferable.

Meanwhile, the window portion 860 is transparent to light emitted from the light-emitting device and may be made of, for example, quartz or sapphire. The window portion 860 has a hemispherical shape as shown in the drawings, but is not limited thereto and may have a spherical or flat sheet shape. The window portion 860 may have a thickness of several um to several tens of um.

The sealing material 870 is formed alone the circumference of the window portion 860 to seal the cavity 813 together with the adhesive 850. The sealing material 870 may be formed of epoxy suitable for preventing water penetration.

The sealing material 870 is formed between the outer wall 811 of the frame portion 800 and the edge of the window portion 860 to prevent water or dust from penetrating into the cavity 813. The sealing material 870 may also penetrate between the window portion 860 and the upper portion 812 of the frame portion 800 to block the passage formed in the adhesive 850.

FIGS. 36 to 38 are top views illustrating a method for manufacturing a light-emitting device according to another embodiment of the present invention.

Referring to FIG. 36, a frame portion 800 comprising a cavity 813 is first prepared. The frame portion 800 may have an upper surface surrounding the cavity 813 and may also have an outer wall 811 surrounding the upper surface 812. Further, the frame portion 800 may comprise lead terminals 820.

The frame portion 800 may be formed by simultaneous firing of a ceramic sheet, but is not limited thereto and may also be a plastic body having lead terminals.

Referring to FIG. 37, a light-emitting device 840 is mounted in the cavity 813 of the frame portion 800. The light-emitting device 840 may be mounted on a submount by flip bonding, and bonding wires can connect the submount 830 with the lead terminals 820. However, the scope of the present invention is not limited thereto, and the light-emitting device 840 may be flip-bonded directly onto the lead frames 820 of the frame portion 800.

Meanwhile, an adhesive 850 is applied to the upper surface 812 surrounding the cavity 813. Although the adhesive 850 may be continuously applied around the cavity 813 in a ring shape, it may be discontinuously applied as shown in FIG. 37. The adhesive 850 is preferably silicone resin.

Referring to FIG. 38, a window portion 860 is disposed to cover the cavity. The adhesive 850 is located between the window portion 860 and the upper portion 812 of the frame portion 800 to attach the window portion 860 to the frame portion 800. The window portion 860 may be disposed at the upper portion of the cavity 813 using a lens holder (not shown). Using the lens holder, the window 860 can be pressed against the frame portion 800, and thus the adhesive 850 spreads laterally to increase the adhesive area. The discontinuously applied adhesive portions 850 can be connected to each other to form a ring, but the scope of the present invention is not limited thereto and an air discharge passage may remain in the adhesive 850. When the air discharge passage remains, expanded air in the cavity can be discharged to the outside through the air discharge passage during curing of the adhesive, and thus the lens can be prevented from delaminating from the upper portion 812 of the frame portion 800.

The adhesive 850 may be thermosetting resin. In this case, after the window portion 860 has been disposed on the adhesive 850, the window portion 860 is bonded to the frame portion 800 by thermal curing of the adhesive. The adhesive is not limited to thermosetting resin and may also be UV-curable resin. The adhesive 850 may be applied to the window portion 860. Alternatively, the window portion 860 having the adhesive 850 applied thereto may be disposed to cover the cavity.

Then, a sealing material (870 in FIG. 34) is formed along the circumference of the window portion 860 to completely seal the cavity 813. The sealing material 870 seals the cavity 870 by blocking the above-described air discharge passage and also seals around the adhesive 850. Thus, even when the adhesive 850 is formed of silicone resin which is relatively permeable to water, water penetration can be prevented because the adhesive 850 is sealed with the sealing material 870.

According to one aspect of the present invention, the bottom and sidewall of the light-emitting device consist of two integrated frames formed of a metal material. Thus, heat generated in the light-emitting portion can be easily dissipated. In addition, the frame portion formed of a selected metal material having high reflectivity makes it easy to emit light to the outside.

The buffer portion is provided between the frame portion and the window portion. The buffer portion has a specific hardness and elongation. Thus, stress that occurs in the frame portion and the window portion due to the difference in thermal expansion coefficient therebetween can be absorbed by the buffer portion, and delamination of the window portion or damage to the buffer portion can be prevented.

In addition, the contact portion has a surface roughness different from the surface roughness of the frame portion and makes it easy to bond a bonding wire during wire bonding. For example, the contact portion can be provided as a depression formed in the surface of the frame portion and increases the electrical contact area between the bonding wire and the frame. Thus, low contact resistance between the bonding wire and the frame can be achieved and power consumption occurring at the interface between the frame and the bonding wire can be minimized.

Further, the through-hole is provided through the bottom or sidewall of the frame portion. The through-hole discharges expanded air, generated during mounting of the window portion, to the outside, to thereby prevent the window portion from delaminating from the buffer portion.

According to another aspect of the present invention, the light-emitting device is firmly attached to the frame portion by forming the bonding aid layer on the chip-mounting region of the frame portion and soldering or reflow-soldering the light-emitting device to the bonding aid layer. In this case, the delamination phenomenon occurring in the prior art is prevented and the reliability of the package is improved.

In addition, due to the bonding layer and the bonding aid layer, which are interposed between the frame portion and the light-emitting device, heat generated in the light-emitting device is rapidly transferred to the frame portion through the bonding layer and the bonding aid layer, and thus the efficiency of heat dissipation from the package is improved compared to that of the prior art package.

Moreover, the bonding aid layer is formed along the upper circumference of the depressed portion, and the window portion is bonded to the bonding aid layer by a Sn-based solder. In this case, the depressed portion can be completely sealed to prevent the reliability of the package from being reduced due to water penetration.

According to still another aspect of the present invention, the lens is formed on the light-emitting device. In this case, a lens having a smooth convex curved shape, which minimizes the quantity of light totally reflected by the interface, can be easily achieved without having to carry out an additional molding process or the like. This lens can significantly improve the efficiency of light extraction from the light-emitting device and can cover and protect the light-emitting device. In addition, the lens is formed by dotting, and thus contributes to an increase in the productivity of the package.

According to yet another aspect of the present invention, a selected suitable sealing material is used so that it can prevent water from penetrating from the outside and also prevent the lens from delaminating from the frame portion during the package manufacturing process. In addition, the combination of the adhesive and the sealing material can effectively prevent water penetration while preventing the loss of light.

What is claimed is:

1. A light-emitting diode package comprising:
    a frame portion comprising a chip-mounting region defined in an upper portion thereof, and first and second frames spaced apart from each other;
    a light-emitting diode mounted on at least a portion of the chip-mounting region with a bonding layer interposed therebetween; and
    a first bonding aid layer formed between the bonding layer and the frame portion,
    wherein the frame portion comprises a depressed portion formed on an upper surface thereof, and the depressed portion comprises the chip-mounting region defined on a bottom thereof,
    wherein the depressed portion comprises a step portion formed at an outer upper end thereof, and
    wherein the step portion comprises a second bonding aid layer formed on an upper surface thereof.

2. The light-emitting diode package of claim 1, wherein the frame portion comprises aluminum (Al) or an Al alloy.

3. The light-emitting diode package of claim 1, wherein the first and second frames are spaced apart from each other by an insulating separation layer.

4. The light-emitting diode package of claim 3, wherein the insulating separation layer is formed so as to be away from the chip-mounting region.

5. The light-emitting diode package of claim 1, wherein the first frame has a larger width than the second frame.

6. The light-emitting diode package of claim 1, wherein the chip-mounting region is defined on the first frame.

7. The light-emitting diode package of claim 1, wherein the bonding layer comprises Sn or a Sn alloy.

8. The light-emitting diode package of claim 1, wherein the first bonding aid layer is formed on the first frame.

9. The light-emitting diode package of claim 1, wherein the first bonding aid layer is made of a material having better wettability to the frame portion than that of the bonding layer.

10. The light-emitting diode package of claim 1, wherein the first bonding aid layer is made of any one selected from among Ni/Ag, Ni/Au, and Cu.

11. The light-emitting diode package of claim 1, wherein the second bonding aid layer is made of a same material as that of the first bonding aid layer.

12. The light-emitting diode package of claim 1, wherein the light-emitting diode emits ultraviolet (UV) light.

13. The light-emitting diode package of claim 1, wherein the light-emitting diode and the frame portion do not contain any organic material thereon.

14. The light-emitting diode package of claim 1, further comprising a lens portion seated to an upper end of the step portion.

15. A light-emitting diode package comprising:
    a frame portion comprising a chip-mounting region defined in an upper portion thereof, and first and second frames spaced apart from each other,
    wherein the frame portion comprises a depressed portion formed on an upper surface thereof, the depressed portion comprises the chip-mounting region defined on a bottom thereof, and the frame portion consists of aluminum (Al) or an Al alloy;
    a light-emitting diode mounted on at least a portion of the chip-mounting region with a bonding layer interposed therebetween;
    a first bonding aid layer formed between the bonding layer and the frame portion; and
    a step portion formed at an outer upper end of the depressed portion,
    wherein the step portion comprises a second bonding aid layer formed on an upper surface thereof.

16. The light-emitting diode package of claim 15, wherein the light-emitting diode emits ultraviolet (UV) light.

17. The light-emitting diode package of claim 15, further comprising
    a lens portion seated to an upper end of the step portion.

* * * * *